United States Patent
Tomisaka et al.

(10) Patent No.: US 7,910,460 B2
(45) Date of Patent: Mar. 22, 2011

(54) METALLIC ELECTRODE FORMING METHOD AND SEMICONDUCTOR DEVICE HAVING METALLIC ELECTRODE

(75) Inventors: Manabu Tomisaka, Nagoya (JP);
Hisatoshi Kojima, Okazaki (JP);
Akihiro Niimi, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/805,537

(22) Filed: Aug. 5, 2010

(65) Prior Publication Data

US 2010/0311191 A1    Dec. 9, 2010

Related U.S. Application Data

(62) Division of application No. 12/073,166, filed on Feb. 29, 2008, now Pat. No. 7,800,232.

(30) Foreign Application Priority Data

| Mar. 6, 2007 | (JP) | 2007-055982 |
| Jul. 26, 2007 | (JP) | 2007-194016 |
| Aug. 29, 2007 | (JP) | 2007-222762 |
| Dec. 27, 2007 | (JP) | 2007-337039 |

(51) Int. Cl.
*H01L 21/00* (2006.01)

(52) U.S. Cl. ........ 438/464; 438/666; 438/614; 257/773; 257/737; 257/781; 257/E21.508; 257/E21.599

(58) Field of Classification Search .......... 438/464, 438/666, 614; 257/773, 737, 781, E21.508, 257/E21.599

See application file for complete search history.

(56) References Cited

U.S. PATENT DOCUMENTS

| 6,428,393 | B1 | 8/2002 | Yukawa et al. |
| 6,548,386 | B1 | 4/2003 | Kondo et al. |
| 7,049,229 | B2 | 5/2006 | Omote et al. |
| 7,662,668 | B2 * | 2/2010 | Sugiura et al. ............... 438/113 |
| 2004/0214420 | A1 | 10/2004 | Brouillette et al. |
| 2005/0161814 | A1 | 7/2005 | Mizukoshi et al. |
| 2005/0170640 | A1 | 8/2005 | Nakagawa et al. |

(Continued)

FOREIGN PATENT DOCUMENTS

JP    A-H11-074242    3/1999

(Continued)

OTHER PUBLICATIONS

Office Action dated Jun. 23, 2009 from the Japan Patent Office in the corresponding JP Application No. 2007-337039 (and English Translation).

(Continued)

*Primary Examiner* — Tu-Tu V Ho
(74) *Attorney, Agent, or Firm* — Posz Law Group, PLC

(57) ABSTRACT

A metallic electrode forming method includes: forming a bed electrode on a substrate; forming a protective film with an opening on the bed electrode to expose the bed electrode from the opening; forming a metallic film covering the protective film and the opening; mounting the substrate on an adsorption stage, and measuring a surface shape of the metallic film by a surface shape measuring means; deforming the substrate by a deforming means so that a difference between the principal surface and a cutting surface is within a predetermined range; measuring a surface shape of the principal surface, and determining whether the difference is within a predetermined range; and cutting the substrate along with the cutting surface so that the metallic film is patterned to be a metallic electrode.

11 Claims, 24 Drawing Sheets

U.S. PATENT DOCUMENTS

| | | |
|---|---|---|
| 2006/0027936 A1 | 2/2006 | Mizukoshi et al. |
| 2006/0084251 A1 | 4/2006 | Nakagawa et al. |
| 2006/0084253 A1 | 4/2006 | Mizukoshi et al. |
| 2006/0199353 A1 | 9/2006 | Kub et al. |
| 2007/0029684 A1 | 2/2007 | Arai et al. |

FOREIGN PATENT DOCUMENTS

| | | |
|---|---|---|
| JP | A-2001-313295 | 11/2001 |
| JP | A-2001-345338 | 12/2001 |
| JP | A-2004-301713 | 10/2004 |
| JP | A-2004-319965 | 11/2004 |
| JP | A-2006-186304 | 7/2006 |
| JP | A-2006-305667 | 11/2006 |
| JP | A-2007-027565 | 2/2007 |
| JP | A-2007-035926 | 2/2007 |

OTHER PUBLICATIONS

Office Action dated Jul. 17, 2009 in the corresponding Chinese patent application No. 2008100824576 (and English translation).

Office Action mailed Aug. 11, 2009 in the corresponding Japanese patent application No. 2007-055982 (and English translation).

Office Action dated Sep. 14, 2009 in the corresponding German patent application No. 10 2008 012 678.0-33 (and English translation).

Office Action mailed Mar. 23, 2010 from Japan Patent Office in corresponding JP application No. 2007-337039 (and English translation).

Office Action dated Nov. 10, 2010 in corresponding CN application No. 200910225920.2 (English translation enclosed).

* cited by examiner

METALLIC ELECTRODE FORMING METHOD AND SEMICONDUCTOR DEVICE HAVING METALLIC ELECTRODE

CROSS REFERENCE TO RELATED APPLICATIONS

This application is a Divisional Application of allowed U.S. patent application Ser. No. 12/073,166, filed on Feb. 29, 2008 now U.S. Pat. No. 7,800,232 which is based on Japanese Patent Applications No. 2007-55982 filed on Mar. 6, 2007, No. 2007-194016 filed on Jul. 26, 2007, No. 2007-222762 filed on Aug. 29, 2007 and No. 2007-337039 filed on Dec. 27, 2007, the disclosures of which are incorporated herein by reference.

FIELD OF THE INVENTION

The present invention relates to a metallic electrode forming method and a semiconductor device having a metallic electrode.

BACKGROUND OF THE INVENTION

In recent years, there has been a demand for inexpensive formation of metallic electrodes, which are used for solder joint or the like, on a circuit surface formed on a semiconductor substrate.

In response to the demand, as a technology for forming metallic electrodes without the necessity of including a photolithography step in patterning, a patent document 1 (JP-A-2006-186304) has disclosed a technology for forming metallic electrodes that is implemented in a process of fabricating a semiconductor device in which: bed electrodes are formed on one side of a semiconductor substrate; a protective film is formed on the bed electrodes and openings are formed in the protective film; and metallic electrodes for connections are formed on the surfaces of the bed electrodes bared through the openings. According to the technology, a level difference which is created so that the surfaces of the bed electrodes bared through the openings will recede from the top of the protective film is utilized in order to pattern a metallic film formed on the bed electrodes and protective film alike through cutting work. Thus, the metallic electrodes are formed.

Like the foregoing technology, when a pattern of metallic electrodes is formed through cutting, cutting work has to be achieved with such high precision that a variance in a magnitude of cutting with the surface of a metallic film as a reference will fall below, for example, 2 μm all over the surface of a semiconductor substrate.

Herein, when the semiconductor substrate is adsorbed or secured to an adsorption stage, the semiconductor substrate is deformed in order to flatten the back side of the semiconductor substrate. Consequently, the principal side of the semiconductor substrate is shaped to have large irregularities while reflecting the original irregular shape of the back side thereof.

Cutting work is performed on a plane parallel to the adsorption stage. Therefore, when the semiconductor substrate has a variance in the thickness, which is larger than a requested degree of precision in the magnitude of cutting, for example, 3 μm, an area where the requested degree of precision in the magnitude of cutting is not satisfied is present in part of the plane. This poses a problem in that a product yield is degraded.

Accordingly, it is required to realize a metallic electrode forming method for semiconductor devices in which metallic electrodes are formed on a semiconductor substrate, which has a variance in the thickness thereof that is larger than a requested degree of precision in a magnitude of cutting, by patterning a metallic film through cutting work that is performed to satisfy the requested degree of precision in the magnitude of cutting, and a semiconductor device.

Further, like the foregoing technology, when a pattern of metallic electrodes is formed through cutting, an area where a metallic film is layered on a protective film made of a resin material has to be cut. When the surface roughness of the protective film intensifies, a dielectric strength decreases. Therefore, the surface roughness of the protective film having undergone cutting work has to be restricted to 100 nm or less.

Since the metallic film and protective film are greatly different from each other in terms of rigidity, when the area where the metallic film is layered on the protective film is cut, a tensile stress that reacts on the protective film gets higher in the vicinity of the tip of a cutting jig. Consequently, the work side of the protective film that is the underlying film of the metallic film is plucked. This poses a problem in that the surface roughness of the protective film having undergone cutting work is intensified.

Accordingly, it is required to realize a metallic electrode forming method for semiconductor devices capable of diminishing the surface roughness of a protective film having undergone cutting work.

SUMMARY OF THE INVENTION

In view of the above-described problem, it is an object of the present disclosure to provide a metallic electrode forming method. It is another object of the present disclosure to provide a semiconductor device having a metallic electrode.

According to a first aspect of the present disclosure, a metallic electrode forming method for a semiconductor device includes: forming a bed electrode on a principal surface of a semiconductor substrate, wherein the bed electrode is electrically connected to a semiconductor element; forming a protective film on the bed electrode, and forming an opening in the protective film so that the bed electrode is exposed from the opening; forming a metallic film on the protective film to cover the protective film and the opening of the protective film; mounting the semiconductor substrate with the metallic film on an adsorption stage, and measuring a surface shape of at least a part of the metallic film by a surface shape measuring means, wherein the adsorption stage adsorbs and fixes the semiconductor substrate on the stage, and wherein the part of the metallic film is disposed on the protective film; deforming the semiconductor substrate based on a surface shape data of the part of the metallic film by using a deforming means capable of displacing the semiconductor substrate so that a difference between the principal surface of the semiconductor substrate and a cutting surface is within a predetermined range, and wherein the deforming means is disposed on a stage side; measuring a surface shape of the principal surface of the semiconductor substrate, and determining whether a difference between the cutting surface and the principal surface of the semiconductor substrate is within a predetermined range; and cutting the semiconductor substrate with the metallic film along with the cutting surface so that the metallic film is patterned to be a metallic electrode when the difference between the cutting surface and the principal surface of the semiconductor substrate is within the predetermined range.

When the semiconductor substrate is adsorbed or secured to the adsorption stage, although a difference between concave and convex parts of the surface portion increases while reflecting the back-side shape thereof, the difference between the concave and convex parts of the surface portion can be decreased. Moreover, the distance between the cutting plane and surface portion can be confined to the predetermined range. Consequently, since the precision in cutting work can be improved, a product yield in formation of metallic electrodes can be improved.

Alternatively, in the cutting the semiconductor substrate with the metallic film, only a part of the metallic film may remain in the opening of the protective film so that the part of the metallic film provides the metallic electrode.

Alternatively, the deforming means may be disposed on a backside of the adsorption stage so that the deforming means is opposite to the semiconductor substrate, and the deforming means displaces the semiconductor substrate via the adsorption stage.

Alternatively, the deforming means may include a plurality of actuators, and each actuator independently displaces the semiconductor substrate. Further, each actuator may be a piezoelectric actuator having a piezoelectric element. Further, the surface shape measuring means may measure the surface shape of the metallic film at a plurality of measurement points, and the number of measurement points is larger than the number of actuators.

Alternatively, the surface shape measuring means may measure the surface shape of the metallic film at a plurality of measurement points, and the deforming means displaces the semiconductor substrate in such a manner that the deforming means applies displacement to the semiconductor substrate at a plurality of displacement points, each of which corresponds to the measurement point.

Alternatively, the surface shape measuring means may be a laser displacement gauge, which scans the surface shape of the metallic film along with a plane parallel to the cutting surface.

According to a second aspect of the present disclosure, a semiconductor device includes: a semiconductor substrate having a principal surface and a backside surface; a bed electrode electrically connected to a semiconductor element, wherein the bed electrode is disposed on the principal surface of the semiconductor substrate; a protective film disposed over the bed electrode, wherein the protective film includes an opening, through which a part of the bed electrode is exposed; and a metallic electrode disposed in the opening of the protective film and contacts the part of the bed electrode. Flatness deviation of a surface of the protective film and a surface of the metallic electrode is smaller than asperity of the backside surface of the semiconductor substrate, and the metallic electrode is provided in such a manner that a metallic film for covering the protective film and the opening of the protective film is cut so as to be patterned as the metallic electrode under a condition where the semiconductor substrate with the metallic film is mounted on an adsorption stage.

In the semiconductor device, a variance in the thickness of a portion cut through cutting work is smaller than the difference between concave and convex parts of the back side of the semiconductor substrate. Consequently, all area is satisfied with a requested degree of precision in a magnitude of cutting. A product yield can be improved.

Alternatively, the opening of the protective film and the part of the bed electrode may provide a trench in such a manner that the protective film provides a sidewall of the trench, and the part of the bed electrode provides a bottom of the trench, and the metallic electrode is disposed on the sidewall and the bottom of the trench.

Alternatively, the semiconductor device may further include: a solder layer disposed on the metallic electrode in the trench.

Alternatively, the metallic electrode may protrude from the opening of the protective film.

Alternatively, the protective film may be made of resin.

According to a third aspect of the present disclosure, a metallic electrode forming method for a semiconductor device includes: forming a bed electrode on a principal surface of a semiconductor substrate, wherein the bed electrode is electrically connected to a semiconductor element; forming a protective film on the bed electrode, and forming an opening in the protective film so that the bed electrode is exposed from the opening; forming a metallic film on the protective film to cover the protective film and the opening of the protective film; mounting the semiconductor substrate on a first adsorption stage to contact the metallic film on the first adsorption stage, wherein the first adsorption stage includes a first flat surface for adsorbing the semiconductor substrate thereon; arranging a flattening stage having a second flat surface, which is parallel to the first flat surface of the first adsorption stage, inserting a filler between a backside surface of the semiconductor substrate and the second flat surface of the flattening stage, and curing the filler so as to flatten a cutting surface of the semiconductor substrate, wherein the backside surface is opposed to the principal surface; and adsorbing and fixing the semiconductor substrate on a second adsorption stage through the filler, and cutting the semiconductor substrate with the metallic film along with the cutting surface so that only a part of the metallic film remains in the opening of the protective film, wherein the part of the metallic film provides a metallic electrode.

In the above method, the flatness of the surface of the metallic film is improved. Moreover, even when the semiconductor substrate is adsorbed or secured during cutting work, the surface of the metallic film will not be shaped to have large irregularities while reflecting the original irregular shape of the back side. Namely, the difference between concave and convex parts of the surface of the metallic film is decreased, and the distance between a cutting plane for the cutting work and the surface of the metallic film is confined to a predetermined range. Consequently, since the precision in cutting work can be improved, a product yield in formation of metallic electrodes can be improved.

Alternatively, the filler may be made of material that exhibits fluidity when being heated.

Alternatively, the inserting the filler may be performed in such a manner that the filler is applied on the second flat surface of the flattening stage, and the flattening stage with the filler is press-contacted to the backside surface of the semiconductor substrate.

According to a fourth aspect of the present disclosure, a metallic electrode forming method for a semiconductor device includes: forming a bed electrode on a principal surface of a semiconductor substrate, wherein the bed electrode is electrically connected to a semiconductor element; forming a protective film on the bed electrode, and forming an opening in the protective film so that the bed electrode is exposed from the opening; forming a metallic film on the protective film to cover the protective film and the opening of the protective film; mounting the semiconductor substrate on a first adsorption stage to contact the metallic film on the first adsorption stage, wherein the first adsorption stage includes a first flat surface for adsorbing the semiconductor substrate thereon; arranging the semiconductor substrate over a third adsorption stage in such a manner that the backside surface faces the third adsorption stage, arranging a displacing means under the third adsorption stage in such a manner that the displacing means is opposite to the semiconductor substrate, and applying displacement to the third adsorption stage so that the third adsorption stage fits and contacts the backside surface of the semiconductor substrate; and adsorbing and fixing the backside surface of the semiconductor substrate on the third adsorption stage, and cutting the semiconductor substrate with the metallic film so that only a part of the metallic film remains in the opening of the protective film, wherein the part of the metallic film provides a metallic electrode.

In the above method, the flatness of the surface of the metallic film is improved. Even when the semiconductor substrate is adsorbed or secured during cutting work, the surface of the metallic film will not be shaped to have large irregularities while reflecting the original irregular shape of the back side. Namely, the difference between concave and convex parts of the surface of the metallic film is decreased, and the distance between a cutting plane for the cutting work and the surface of the metallic film is confined to a predetermined range. Consequently, since the precision in cutting work can be improved, a product yield in formation of metallic electrodes can be improved.

Alternatively, the displacing means may include a plurality of actuators, and each actuator is capable of controlling the displacement independently.

Alternatively, each actuator may be a piezoelectric actuator including a piezoelectric element.

According to a fifth aspect of the present disclosure, a metallic electrode forming method for a semiconductor device includes: forming a bed electrode on a principal surface of a semiconductor substrate, wherein the bed electrode is electrically connected to a semiconductor element; forming a protective film on the bed electrode, and forming an opening in the protective film so that the bed electrode is exposed from the opening; forming a metallic film on the protective film to cover the protective film and the opening of the protective film; and cutting the semiconductor substrate with the metallic film by using a cutting tool so that only a part of the metallic film remains in the opening of the protective film, wherein the part of the metallic film provides a metallic electrode. The cutting tool includes a cutting surface, which has a first blade portion and a second blade portion. The first blade portion is disposed on a first side of the cutting surface, and the second blade portion is disposed on a second side of the cutting surface. The first side of the cutting surface faces a forward direction of the cutting tool, and the second side of the cutting surface faces a backward direction of the cutting tool. The cutting tool moves in the forward direction, and the backward direction is opposite to the forward direction. The cutting tool moves in a stepwise manner with a predetermined pitch. The pitch is determined in such a manner that: the first blade portion cuts a stacked layer of the metallic film on the protective film; the cutting tool is displaced by the predetermined pitch; and the second blade portion cuts a region in which the protective film is exposed.

In the above method, an area where the protective film which has been cut by the first blade portion and whose surface has been plucked to intensify the surface roughness is bared can be cut using the second blade portion during cutting to be performed after the cutting tool is moved by the designated pitch. Consequently, the surface roughness of the protective film having undergone cutting work can be diminished.

Alternatively, the first blade portion may be connected to the second blade portion with a predetermined arc having a curvature radius defined as R, the cutting tool cuts the protective film with a cutting depth defined as d, and the predetermined pitch defined as P has a relationship of $0 < P \leq 2/3 (2Rd - d^2)^{1/2}$.

Alternatively, the first blade portion may be connected to the second blade portion with a first face and a second face, each of which tilts with reference to a surface of the metallic film by a predetermined angle defined as θ. The cutting tool may cut the protective film with a cutting depth defined as d, and the predetermined pitch defined as P may have a relationship of $0 < P \leq 2d/(3 \tan \theta)$.

Alternatively, the protective film may be made of polyimide resin, and the cutting tool cuts the protective film with a cutting depth equal to or smaller than 8 μm.

BRIEF DESCRIPTION OF THE DRAWINGS

The above and other objects, features and advantages of the present invention will become more apparent from the following detailed description made with reference to the accompanying drawings. In the drawings:

FIG. 5A is a sectional view of the surface shape control apparatus, and FIG. 5B is a plan explanatory view thereof seen from the side of a semiconductor substrate;

FIG. 6A is a profile of thicknesses of the semiconductor substrate detected during adsorption, FIG. 6B is a profile of displacements applied by a deformation unit, and FIG. 6C is a profile of thicknesses of the semiconductor substrate displaced by the deformation unit;

FIG. 6A is a sectional view, and FIG. 6B is a plan explanatory view of the apparatus seen from a semiconductor substrate side;

DETAILED DESCRIPTION OF THE PREFERRED EMBODIMENTS

First Embodiment

Figure 1:
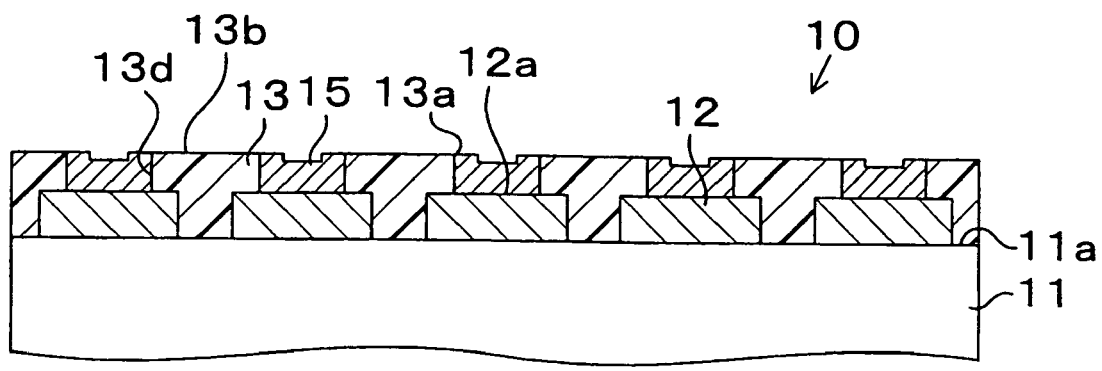
FIG. 1 is a sectional explanatory view of a semiconductor device having metallic electrodes formed thereon according to a metallic electrode forming method of a first embodiment.
Figure 5A:
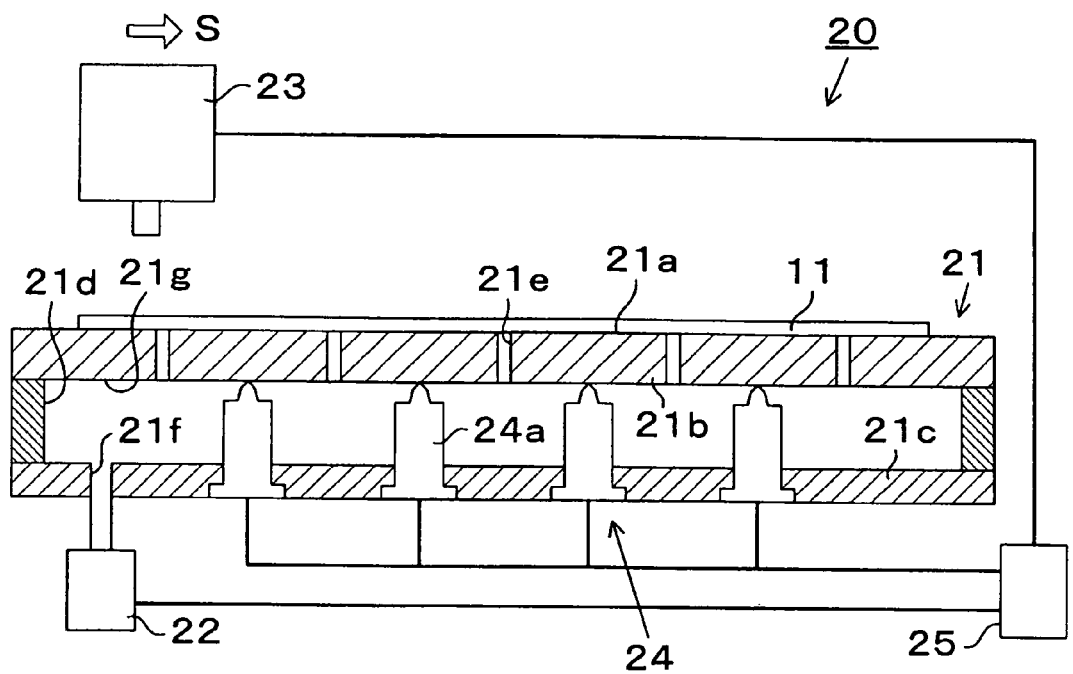
FIG. 5A and FIG. 5B are explanatory views showing a surface shape control apparatus.
Figure 5B:
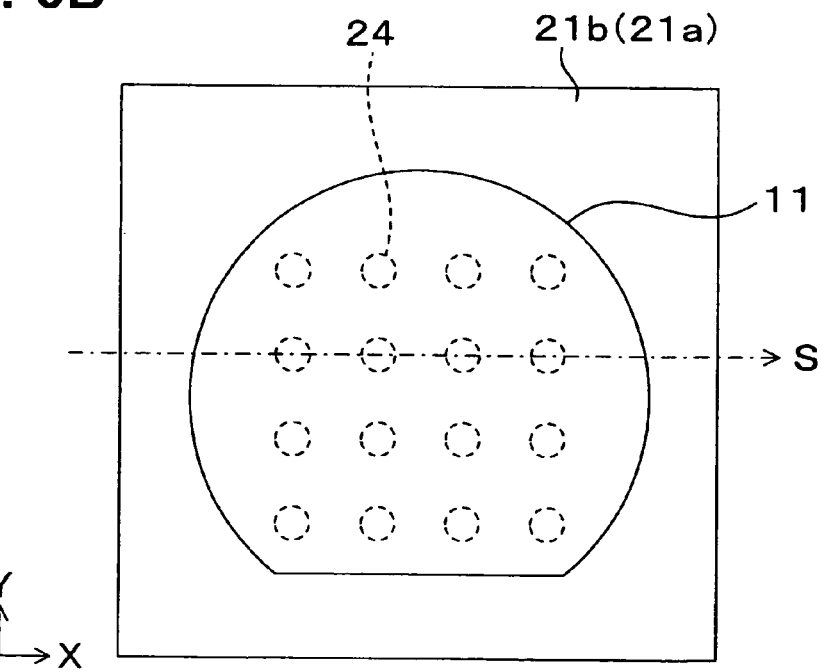
Figure 6A:
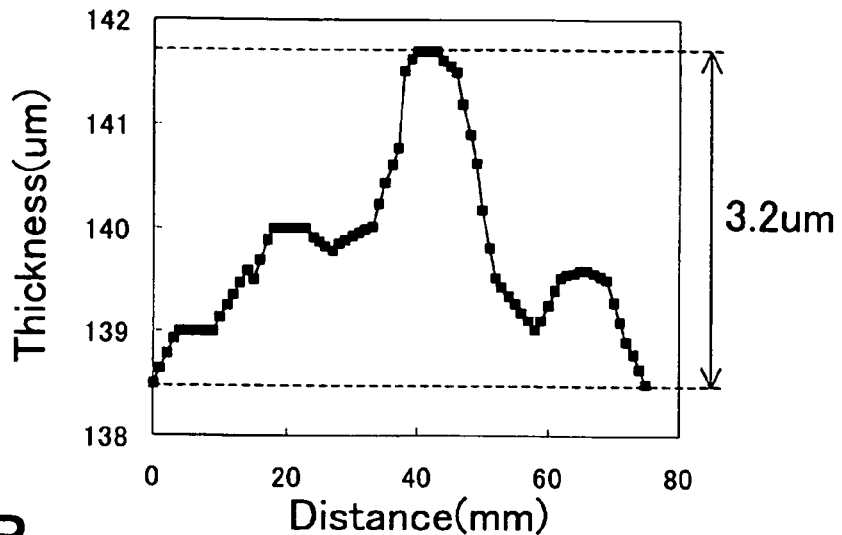
FIG. 6A to FIG. 6C are explanatory diagrams showing examples of surface shape control for a semiconductor substrate.
Figure 6B:
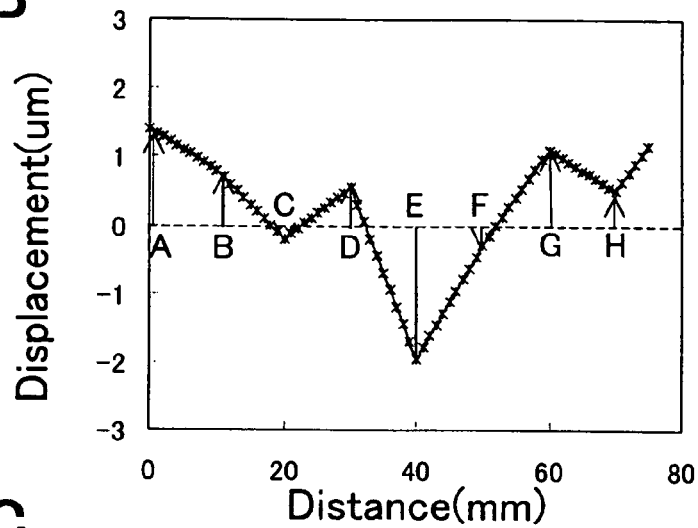
Figure 6C:
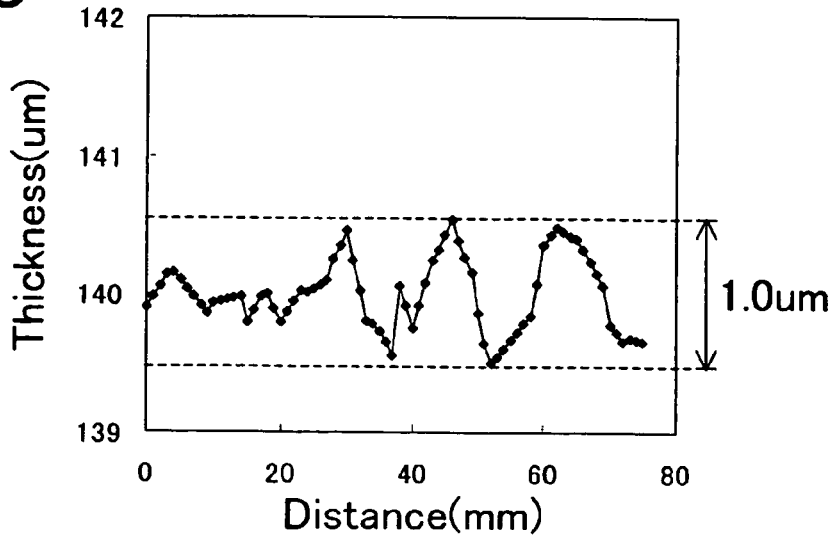
Figure 7:
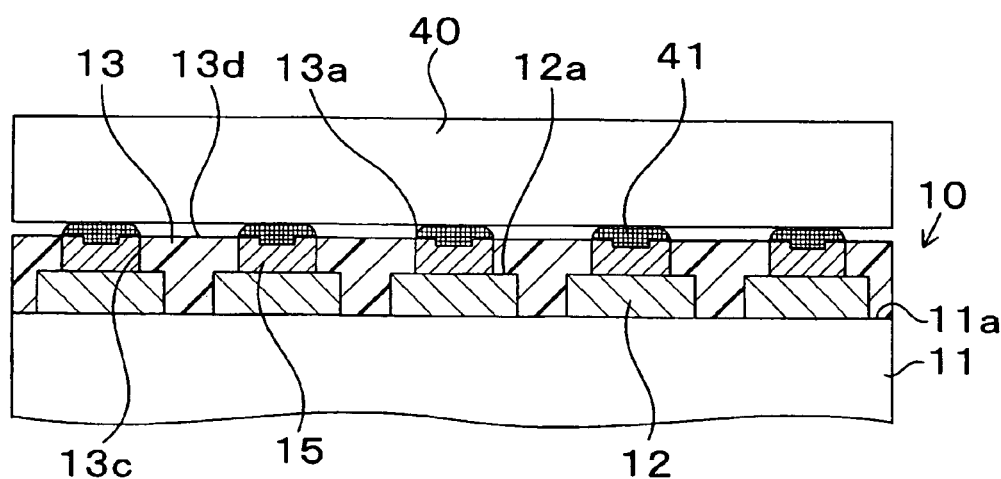
FIG. 7 is a sectional explanatory view of a semiconductor device whose metallic electrodes are soldered.

Referring to the drawings, the first embodiment of a metallic electrode forming method for semiconductor devices and a semiconductor device in accordance with the present invention will be described below. FIG. 1 is a sectional explanatory view of a semiconductor device having metallic electrodes formed thereon according to the metallic electrode forming method of the first embodiment. FIG. 2A to FIG. 4B show steps included in the metallic electrode forming method. FIG. 5A and FIG. 5B are explanatory views of a surface shape control apparatus. FIG. 5A is a sectional view, and FIG. 5B is a plan explanatory view of the surface shape control apparatus seen from a semiconductor substrate side. FIG. 6A to FIG. 6C are explanatory diagrams presenting an example of surface shape control for the semiconductor substrate. FIG. 6A is a profile of thicknesses of the semiconductor substrate detected during adsorption, FIG. 6B is a profile of displacements applied by a deformation unit, and FIG. 6C is a profile of thicknesses of the semiconductor substrate displaced by the deformation unit. FIG. 7 is a sectional explanatory view of the semiconductor device whose metallic electrodes are soldered.

A semiconductor device 10 to be adapted to a power card or the like is formed with a semiconductor substrate 11, which is made of silicon or the like, as a body. Bed electrodes 12 that are element electrodes are formed on the principal side 11a of the semiconductor substrate 11 using pure aluminum (Al) or an aluminum alloy such as an aluminum-silicon (Al—Si) alloy or an aluminum-silicon-copper (Al—Si—Cu) alloy.

A protective film 13 made of an insulating material is formed to cover both the principal side 11a and part of each of the bed electrodes 12. The protective film 13 is made of, for example, a polyimide resin whose thickness ranges from 1 to 20 μm.

Openings 13a through which the bed electrodes 12 are bared are formed in the protective film 13 from the surface of the protective film toward the bed electrodes 12.

A level difference is created so that the surfaces 12a of the bed electrodes 12 bared through the openings 13a will recede from the top 13b of the protective film 13.

Metallic electrodes 15 to which wires are coupled are formed to cover both the surfaces 12a of the bed electrodes 12 bared through the respective openings 13a and the flanks 13c of the protective film 13 creating the level difference. The metallic electrodes 15 are formed using a titan (Ti)-nickel (Ni)-gold (Au) laminate or a Ni—Au laminate whose components are layered in that order on the sides of the bed electrodes 12, and are electrically connected to the respective bed electrodes 12.

Next, a method of forming the metallic electrodes 15 will be described below.

Figure 2A:
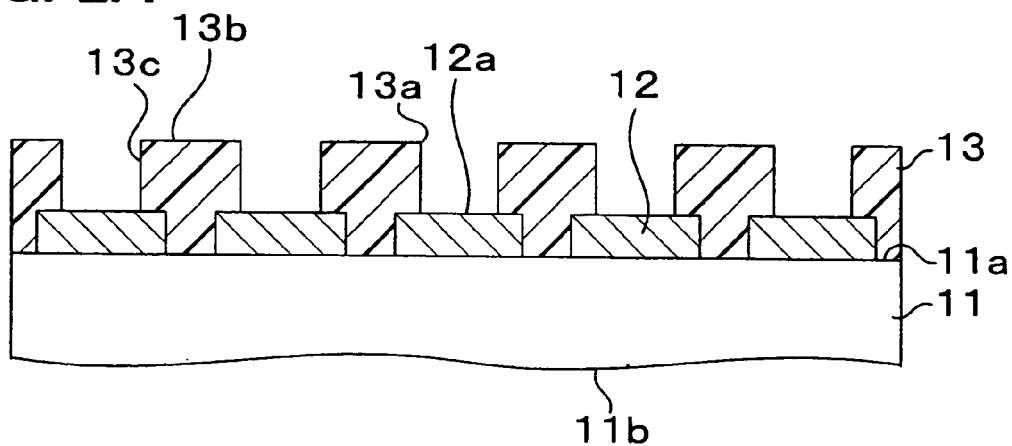
FIG. 2A to FIG. 2C show steps included in the metallic electrode forming method of the first embodiment.

To begin with, as shown in FIG. 2A, the semiconductor substrate 11 having semiconductor elements, which are not shown, formed therein is prepared, and patterned according to a photolithography method in order to form the bed electrodes 12, which are electrically connected to the semiconductor elements, on the principal side 11a thereof.

Thereafter, the protective film 13 having a thickness of, for example, 10 μm and being made of a polyimide resin is formed according to a spin coat method or the like. The openings 13a through which the bed electrodes 12 are bared are formed from the surface of the protective film toward the bed electrodes 12 according to a photolithography method. When a resin material is adopted as the protective film 13, the bed electrodes 12 that have thickness can be appropriately covered.

A level difference is created so that the surfaces 12a of the bed electrodes 12 bared through the openings 13a will recede from the top 13b of the protective film 13.

Figure 2B:
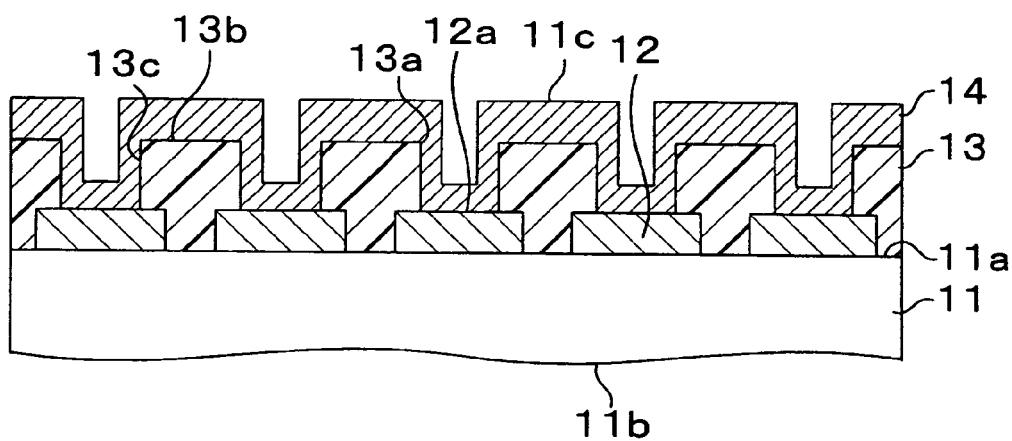

Thereafter, as shown in FIG. 2B, a metallic film 14 is formed to cover each of the bed electrodes 12, the top 13b of the protective film 13, and the flanks 13c of the protective film 13 according to a plating method dr sputtering method. The metallic film 14 may be a laminate such as a Ti—Ni—Au laminate or a Ni—Au laminate or may be a uni-laminar metallic film.

Figure 2C:
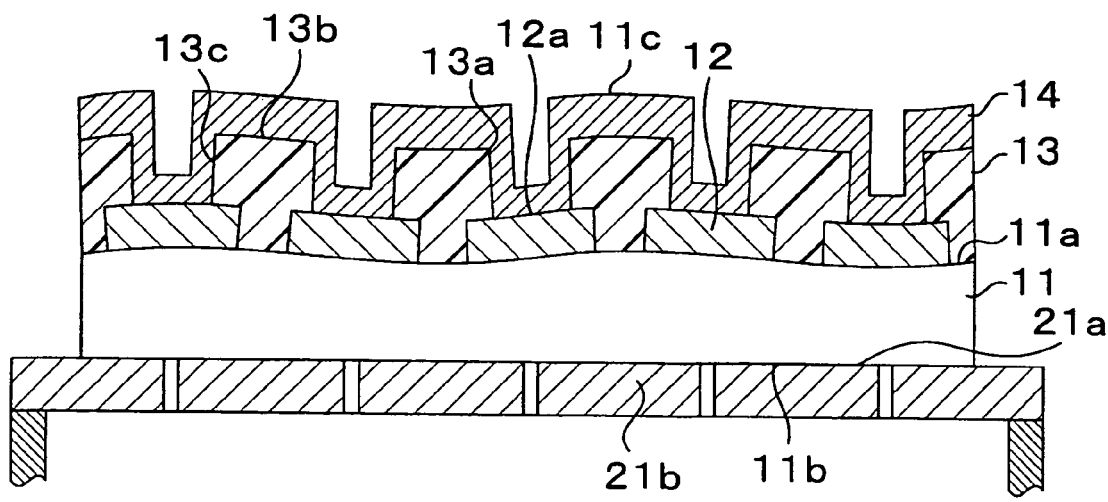

Thereafter, as shown in FIG. 2C, the semiconductor substrate 11 is placed on an adsorption surface 21a of an adsorption stage 21b included in a surface shape control apparatus 20 (FIG. 5A and FIG. 5B) with the back side 11b of the semiconductor substrate 11 brought into contact with the adsorption surface 21a, and adsorbed or secured. At this time, the back side 11b is flattened due to adsorptive force generated on the adsorption surface 21a. Consequently, the surface portion 11c of the semiconductor substrate 11 is shaped to have large irregularities while reflecting the original irregular shape of the back side 11b.

Now, the surface portion 11c refers to a portion of the metallic film 14 covering the top 13b of the protective film 13. Moreover, the surface shape refers to a profile of the irregularities of the surface portion 11c and is represented by a profile of values of the distance between the surface portion 11c and a cutting plane P to be described later. The surface shape can be numerically expressed based on the thickness of the semiconductor substrate 11 or the surface roughness thereof which is observed from the surface portion 11c, and represented by surface shape data.

Now, the configuration of the surface shape control apparatus 20 will be described with reference to FIG. 5A and FIG. 5B.

The surface shape control apparatus 20 includes the stage 21 on which the semiconductor substrate 11 is placed, an adsorption unit 22 that adsorbs or secures the semiconductor substrate 11, a surface shape measurement unit 23 that measures the shape of the surface portion 11c of the semiconductor substrate 11, a deformation unit 24 that deforms the semiconductor substrate 11 from the back side 11b thereof, and a control computer 25 that controls these units.

The stage 21 has a hollowed shape and includes a hollow 21d between the adsorption stage 21b and a lower stage 21c.

The adsorption stage 21b includes an adsorption surface 21a that adsorbs or secures the semiconductor substrate 11, and adsorption holes 21e through which adsorptive force that is generated by depressurizing the hollow 21d using the adsorption unit 22 such as a vacuum pump reacts on the semiconductor substrate 11.

The adsorption stage 21b is formed to be easily deformable in order to apply displacements, which are generated by the deformation unit 24 to be described later, to the semiconductor substrate 11. Herein, the adsorption stage 21b is formed with a stainless steel plate having a thickness of 1 mm.

A depressurization hole 21f through which the adsorption unit 22 is connected and the deformation unit 24 are formed in or disposed on the lower stage 21c.

In the present embodiment, multiple piezoelectric actuators 24a are adopted as the deformation unit 24. The piezoelectric actuators 24a are arranged in the form of a lattice with a predetermined space, for example, a space of 1 cm between adjoining ones. The piezoelectric actuators 24a are abutted on the back side 21g of the adsorption stage 21b and disposed so that they can generate upward displacements. FIG. 5A and FIG. 5B are concerned with a case where sixteen piezoelectric actuators 24a are, for convenience' sake, arranged in total in four columns and four rows. The piezoelectric actuators 24a can generate mutually different displacements that can be mutually independently controlled by the control computer 25. The displacements generated by the respective piezoelectric actuators 24a can be highly precisely controlled, the backlash made by the piezoelectric actuators 24 is limited, and the amount of heat dissipated from the piezoelectric actuators 24a during operation is small.

When the piezoelectric actuators 24a generate upward displacements, the upward displacements are applied to the semiconductor substrate 11 via the adsorption stage 21b. Consequently, the semiconductor substrate 11 is deformed. The piezoelectric actuators 24a apply displacements to the semiconductor substrate 11 via the adsorption stage 21b. Therefore, such an event can be prevented that a stress is locally exerted in the semiconductor substrate 11 by the piezoelectric actuators 24a and causes the semiconductor substrate 11 to locally deform.

Moreover, a negative pressure produced by the adsorption unit 22 may be used to apply downward displacements to the semiconductor substrate 11.

The deformation unit 24 may be disposed to have the upper end thereof joined to the back side 21g of the adsorption stage 21b. Using this construction, when upward displacements are applied to the semiconductor substrate 11, a play is not made. Moreover, downward displacements may be applied to the semiconductor substrate 11 via the adsorption stage 21b.

The surface shape measurement unit 23 is a unit that measures the surface shape of the surface portion 11c of the semiconductor substrate 11. In the present embodiment, a laser displacement gauge is adopted as the surface shape measurement unit 23. Using the laser displacement gauge, the surface shape can be highly precisely measured in a non-contact manner. Moreover, a measurement time can be shortened.

Surface shape data of the surface portion 11c measured by the surface shape measurement unit 23 is outputted to the control computer 25.

Figure 3A:
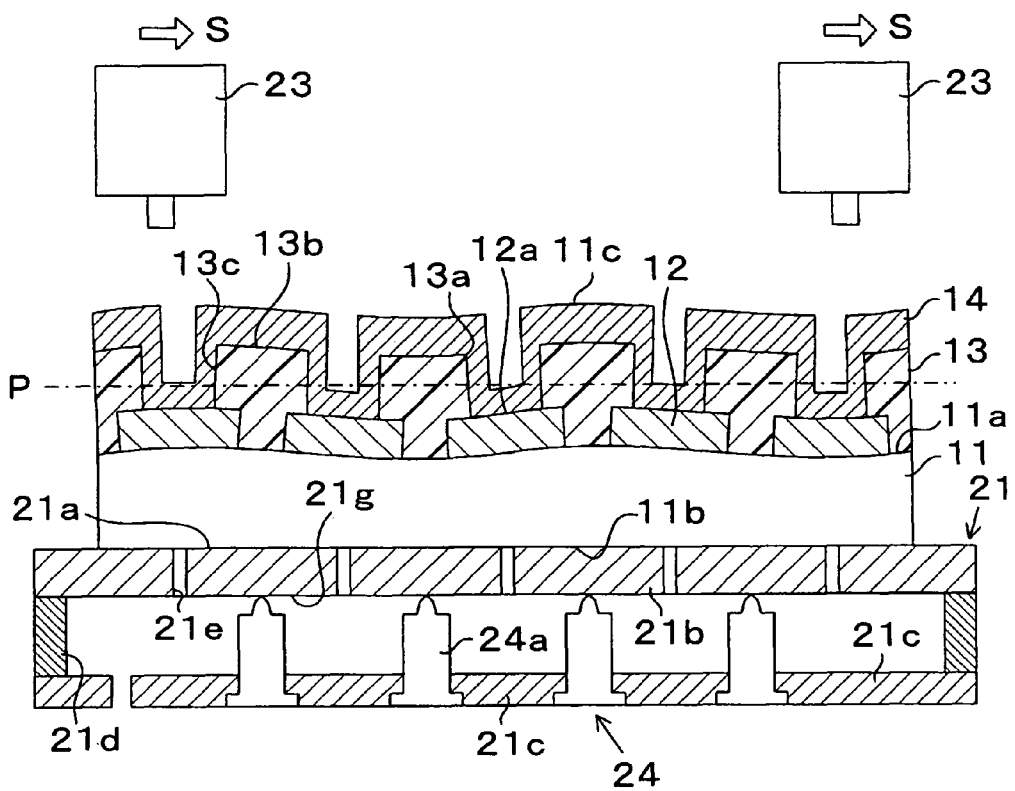
FIG. 3A and FIG. 3B show steps included in the metallic electrode forming method of the first embodiment.

At the next step, as shown in FIG. 3A, the surface shape measurement unit 23 is used to measure the surface shape of the surface portion 11c of the semiconductor substrate 11. Herein, measurement points are designated in the form of a lattice on the surface portion 11c of the semiconductor substrate 11. The surface shape measurement unit 23 is swept along a plane parallel to the cutting plane P in order to measure the thickness of the semiconductor substrate 11. Measurement data items of the respective points are outputted to the control computer 25. The control computer 25 interpolates data of a point between each pair of measurement points on the basis of the measurement data items of the respective points, and thus constructs surface shape data of the surface portion 11c of the semiconductor substrate 11.

The surface shape measurement unit 23 is, as indicated with a straight line S in FIG. 5B, swept so that the measurement points will include points on the surface portion 11c to which displacements are applied by the deformation unit 24.

Consequently, since a measurement point to which the largest displacement is applied can be measured, the precision in measurement of the surface shape can be improved.

Moreover, the number of measurement points may be larger than the number of piezoelectric actuators 24a. In this case, displacements occurring in areas among the piezoelectric actuators 24a can be measured, and the number of measurement points whose data items can be used to interpolate data items of points among the piezoelectric actuators. Consequently, the precision in measurement of the surface shape can be improved.

FIG. 6A shows an example of surface shape data. In FIG. 6A, the axis of abscissas indicates positions in the direction of an X axis (FIG. 5B) on the semiconductor substrate 11, and the axis of ordinates indicates thicknesses of the semiconductor substrate 11. FIG. 6A is a profile of thicknesses at points including points on the surface portion 11c, to which displacements are applied by the deformation unit 24, in an area of approximately 80 mm wide measured at intervals of 1 mm. Herein, a difference between concave and convex parts of the surface portion 11c of the semiconductor substrate 11 is 3.2 µm at maximum.

Figure 3B:
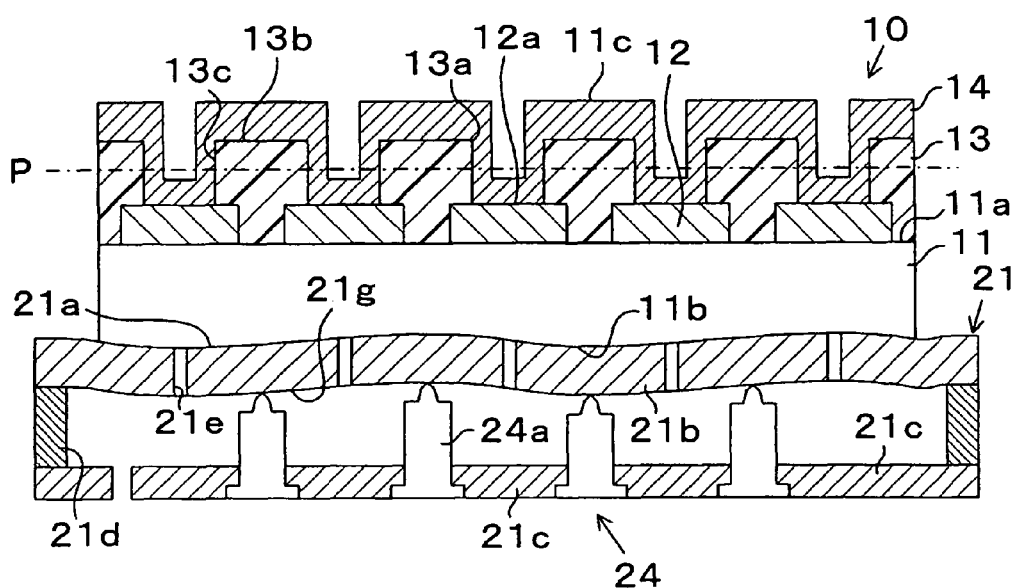

Thereafter, as shown in FIG. 3B, the deformation unit 24 is used to apply displacements to the back side 11b of the semiconductor substrate 11. Thus, the semiconductor substrate 11 is deformed so that a variance in the distance between the cutting plane P, which is designated in parallel with the adsorption stage 21b, and the surface portion 11c will fall below a requested degree of precision in cutting work to be described later. The surface shape is controlled. In other words, the semiconductor substrate 11 is deformed so that the difference between concave and convex parts of the surface portion 11c will fall below the requested degree of precision in cutting work.

To be more specific, based on the surface shape data constructed by the control computer 25, the control computer 25 controls magnitudes of displacements generated by the respective piezoelectric actuators 24a of the deformation unit 24 so that the difference between concave and convex parts of the surface portion 11c will fall below the requested degree of precision, for example, 1 µm. The displacements are then applied to the back side 11b of the semiconductor substrate 11 via the adsorption stage 12b.

Now, the relationship between the displacements generated by the respective piezoelectric actuators 24a of the deformation unit 24 and the magnitude of deformation of the semiconductor substrate 11 is predetermined through simulation or actual measurement.

FIG. 6B and FIG. 6C show examples of surface shape control. In FIG. 6B, the axis of abscissas indicates positions in the X-axis direction on the semiconductor substrate 11, and the axis of ordinates indicates displacements applied by the deformation unit 24. Herein, alphabets A to H denote the disposed positions of the respective piezoelectric actuators.

The profile of displacements is obtained by performing linear interpolation on the basis of the displacements applied by the actuators A to H.

A positive value represents an upward displacement, and a negative value represents a downward displacement. The displacements generated by the piezoelectric actuators C, E, and F are displacements derived from depressurization by the adsorption unit 22.

Thereafter, the surface shape measurement unit 23 is used to measure the surface shape of the surface portion 11c of the deformed semiconductor substrate 11. The control computer 25 decides whether a variance in the distance between the cutting plane P and surface portion 11c falls below the requested degree of precision in cutting work. Herein, a decision is made on whether the difference between concave and convex parts of the surface portion 11c falls below 1 µm.

In the present embodiment, as shown in FIG. 6C, the difference between concave and convex parts of the surface portion 11c falls below 1 µm. The surface shape can therefore be controlled so that the variance in the distance between the cutting plane P and surface portion 11c falls below the requested degree of precision in cutting work.

Figure 4A:
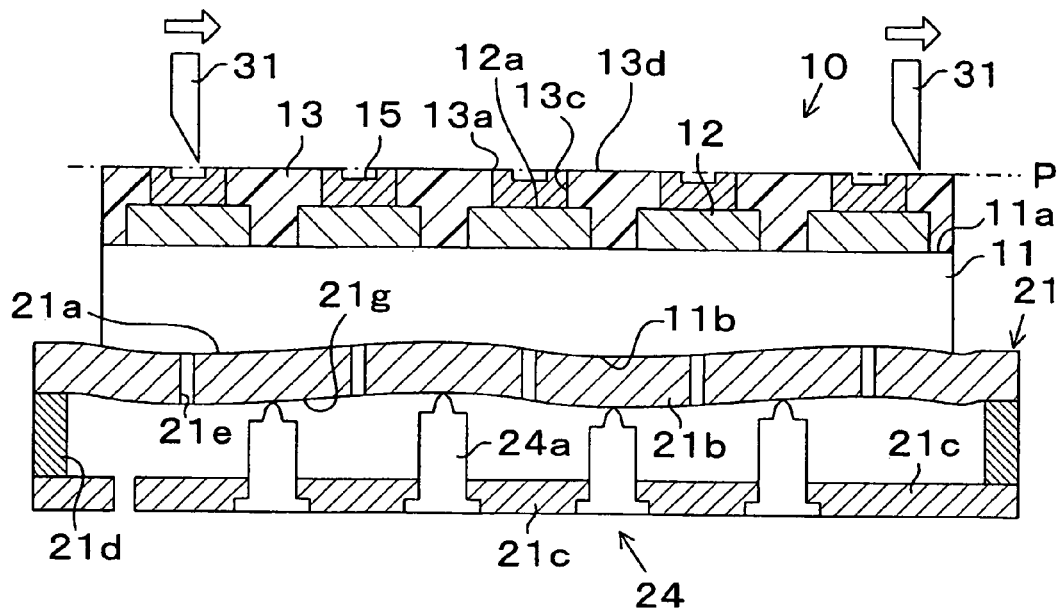
FIG. 4A and FIG. 4B show steps included in the metallic electrode forming method of the first embodiment.

If the control computer 25 decides that the variance in the distance between the cutting plane P and surface portion 11c falls below the requested degree of precision in cutting work, a cutting tool 331 is, as shown in FIG. 4A, used to perform cutting work on the surface of the metallic film 14. The metallic film 14 is thus patterned in order to form the metallic electrodes 15. At this time, the top 13b of the protective film 13 is also subjected to the cutting work, and a new top 13d appears.

In the present embodiment, the relative speed between the cutting tool 331 and semiconductor device 10 is set to 20 m/s, and a pitch for cutting work is set to 70 µm. Moreover, the degree of precision in the bite of the cutting tool 331 relative to the height of the metallic film 14 is 0.1 µm or less.

Cutting work is performed all over the principal side 11a of the semiconductor substrate 11 under the above cutting conditions, whereby the metallic film 14 is patterned so that the metallic film will be removed from the top 13b of the protective film 13 and will remain intact inside the openings 13a. Consequently, the metallic electrodes 15 are formed. Namely, the metallic electrodes 15 are formed to cover both the surfaces 12a of the bed electrodes 12 bared through the openings 13a and the flanks 13c of the protective film 13 creating a level difference.

Figure 4B:
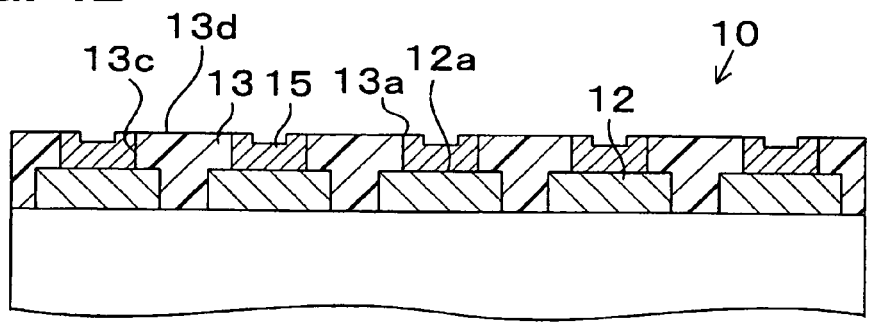

As shown in FIG. 4B, the semiconductor substrate 11 is released from the displacements generated by the piezoelectric actuators 24a, and detached from the stage 21. Consequently, the metallic electrodes 15 are formed on the semiconductor substrate 11.

According to the foregoing steps, cutting work is performed on the entire principal side 11a of the semiconductor substrate 11 in order to pattern the metallic film 14 so that the metallic film 14 will be removed from the top 13b of the protective film 13 and remain intact inside the openings 13a. Thus, the metallic electrodes 15 are formed. The metallic electrodes 15 are formed to cover both the surfaces 12a of the bed electrodes 12 bared through the openings 13a and the flanks 13c of the protective film 13 creating a level difference. Compared with a case where the metallic electrodes 15 are formed only on the surfaces 12a of the bed electrodes 12, the strength of the metallic electrodes 15 is improved.

Moreover, when the semiconductor substrate 11 is adsorbed or secured to the adsorption stage 21b, the difference between concave and convex parts of the surface portion 11c of the semiconductor substrate 11 increases while reflecting the shape of the back side 11b. However, the difference between concave and convex parts of the surface portion 11c can be decreased and the distance between the cutting plane P and surface portion 11c can be confined to a predetermined range (set to a requested degree of precision in work). Therefore, the precision in cutting work can be improved. Eventually, a product yield in formation of metallic electrodes can be improved.

The metallic electrodes 15 are coupled to other member using a member such as solder or wire. For example, as shown in FIG. 7, a heat sink 40 may be joined to the metallic electrodes 15 serving as emitter electrodes via solder 41.

The solder 41 is in contact with the regions of the metallic electrodes 15 formed on the flanks 13c of the protective film 13 creating a level difference. Consequently, an area by which the solder 41 is in contact with the metallic electrodes 15 is increased. Eventually, the joint strength of the solder 41 is improved.

The bed electrodes 12 electrically connected to semiconductor elements are formed on the principal side 11a of the semiconductor substrate 11. The protective film 13 is formed to cover the bed electrodes 12. The openings 13a through which the bed electrodes are bared are formed from the surface of the protective film 13 toward the bed electrodes 12. The metallic film 14 is formed to cover both the protective film 13 and the surfaces of the bed electrodes 12 bared through the openings 13a. Cutting work is performed to cut the semiconductor substrate on the cutting plane P, whereby the metallic film 14 is patterned so that only the portion of the metallic film 14 formed inside the openings 13a will remain intact. Thus, the metallic electrodes 15 are formed.

At this time, the semiconductor substrate 11 on which the metallic film 14 is formed is adsorbed or secured to the adsorption stage 21b. Thereafter, the surface shape measurement unit 23 is used to acquire surface shape data of the surface portion 11c of the metallic film 14 of the semiconductor substrate 11, which is adsorbed or secured to the adsorption stage 21, covering the protective film 13. Based on the surface shape data, the semiconductor substrate is deformed by the deformation unit 24, which deforms the semiconductor substrate by applying displacements to the semiconductor substrate from the adsorption stage 21b side, so that the distance between the cutting plane P designated in parallel with the adsorption stage 21b and the surface portion 11c of the semiconductor substrate 11 will fall within a predetermined range (fall below the requested degree of precision in cutting work). The surface shape measurement unit 23 is used to measure the surface shape of the deformed semiconductor substrate 11. If a decision is made that the distance between the cutting plane P and surface portion 11c falls within the predetermined range, cutting work is performed on the cutting plane P with the semiconductor substrate 11, which is deformed by the deformation unit 24, left adsorbed or secured to the adsorption stage 21b.

Consequently, when the semiconductor substrate 11 is adsorbed or secured to the adsorption stage 21b, although the difference between concave and convex parts of the surface portion 11c increases while reflecting the shape of the back side 11b, the difference between concave and convex parts of the surface portion 11c can be decreased. Moreover, the distance between the cutting plane P and surface portion 11c can be confined to the predetermined range. Consequently, the precision in cutting work can be improved, and a product yield in formation of metallic electrodes can be improved.

The metallic electrodes 15 are formed to cover both the surfaces 12a of the bed electrodes 12 bared through the openings 13a and the flanks 13c of the protective film 13 creating a level difference. Therefore, compared with a case where the metallic electrodes 15 are formed only on the surfaces 12*a* of the bed electrodes 12, the strength of the metallic electrodes 15 can be improved. Moreover, when the metallic electrodes 15 are soldered, a wetted area of solder can be expanded. Eventually, joint strength can be improved.

The piezoelectric actuators 24*a* of the deformation unit 24 are disposed to abut on the back side 21*g* of the adsorption stage 21*b*, and apply displacements to the semiconductor substrate 11 via the adsorption stage 21*b*. Therefore, such an event can be prevented that since a stress is locally imposed on the semiconductor substrate 11 by the piezoelectric actuators 24*a*, the semiconductor substrate 11 is locally deformed.

The deformation unit 24 includes multiple piezoelectric actuators 24*a* whose displacements are controllable. The deformation unit 24 can therefore apply different displacements according to the deformed state of the semiconductor substrate 11. Consequently, the surface shape of the semiconductor substrate 11 can be highly precisely controlled. The displacements applied by the piezoelectric actuators 24*a* can be highly precisely controlled, the backlash made thereby is limited, and the amount of heat dissipated thereby during operation is small.

The number of measurement points at which the surface shape measurement unit 23 is used to construct surface shape data is larger than the number of piezoelectric actuators 24*a*. Displacements occurring in areas among the piezoelectric actuators 24*a* can therefore be measured. Eventually, the precision in measurement of the surface shape can be improved.

The surface shape measurement unit 23 measures at least the surface shape of the surface portion 11*c* at points to which displacements are applied by the deformation unit 24. Therefore, since the most greatly deformed portion can be measured, the precision in measurement of the surface shape can be improved.

Since the surface shape measurement unit 23 is a laser displacement gauge to be swept along a plan parallel to the cutting plane P, the surface shape can be highly precisely measured in a non-contact manner. Moreover, a measurement time can be shortened.

Second Embodiment

The second embodiment of a metallic electrode forming method for semiconductor devices and a semiconductor device in accordance with the present invention will be described below with reference to the drawings. Herein, a description will be made on the assumption that Au electrodes are adopted as electrodes which bring power elements such as bipolar transistors or transverse diffusion transistors (LD-MOS) into contact with an external substrate. FIG. 8A to FIG. 10 are sectional explanatory diagrams concerning an electrode forming method for semiconductor devices of the second embodiment.

Incidentally, the same reference numerals will be assigned to components identical to those of the first embodiment. An iterative description will be omitted.

A method of forming the metallic electrodes 15 will be described below.

Figure 8A:
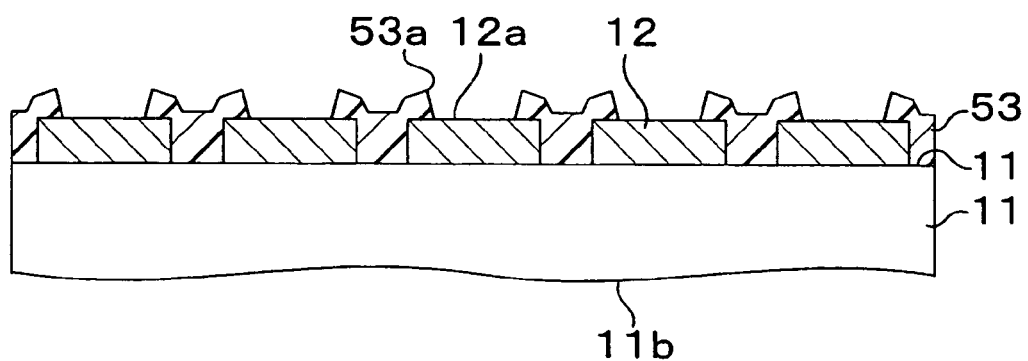
FIG. 8A and FIG. 8B show steps included in a metallic electrode forming method of a second embodiment.

First, as shown in FIG. 8A, the semiconductor substrate 11 having power elements, which are not shown, formed thereon is prepared, and patterned according to a photolithography method in order to form the bed electrodes 12, which are electrically connected to the semiconductor elements, on the principal side 11*a* thereof.

Thereafter, a protective film 53 made of silicon nitride (P—SiN) is formed on the tops of the bed electrodes 12, and openings 53*a* through which parts of the bed electrodes 12 are bared are formed from the surface of the protective film 53 toward the bed electrodes 12.

Figure 8B:
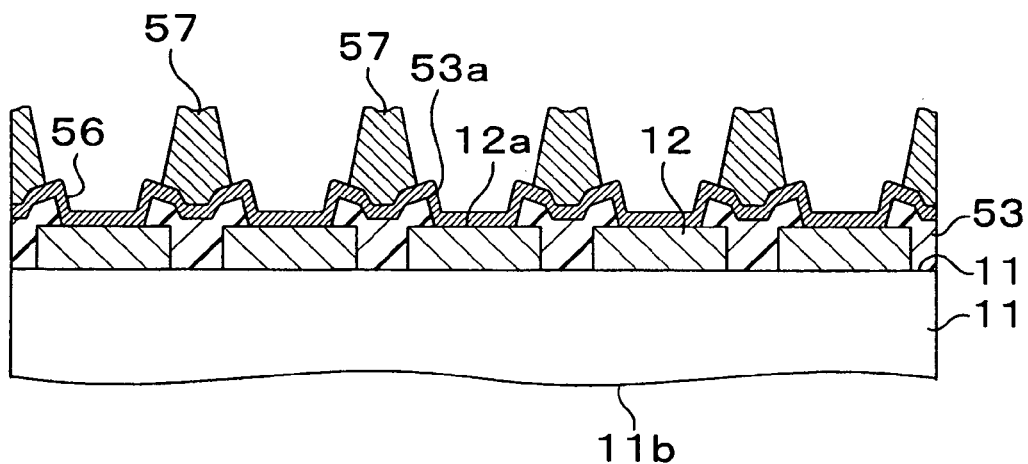

Thereafter, as shown in FIG. 8B, a barrier seed layer 56 is formed for covering the surface of the protective film 53 and the bed electrodes 12 according to a sputtering method. In the present embodiment, the barrier seed layer 56 is formed by laying a copper (Cu) film on a titanium nitride (TiN) film.

A photolithography method and an etching method are used to form a photoresist film 57 of a predetermined shape through patterning.

Figure 9A:
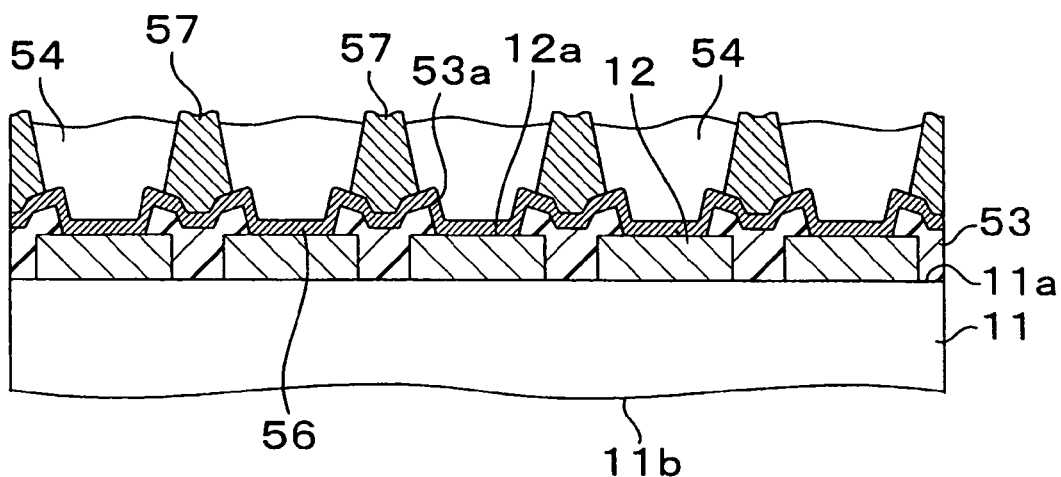
FIG. 9A and FIG. 9B show steps included in the metallic electrode forming method of the second embodiment.

Thereafter, as shown in FIG. 9A, the photoresist film 57 is used as a mask to form an Au electrode film 54 according to an electrolytic plating method.

Figure 9B:
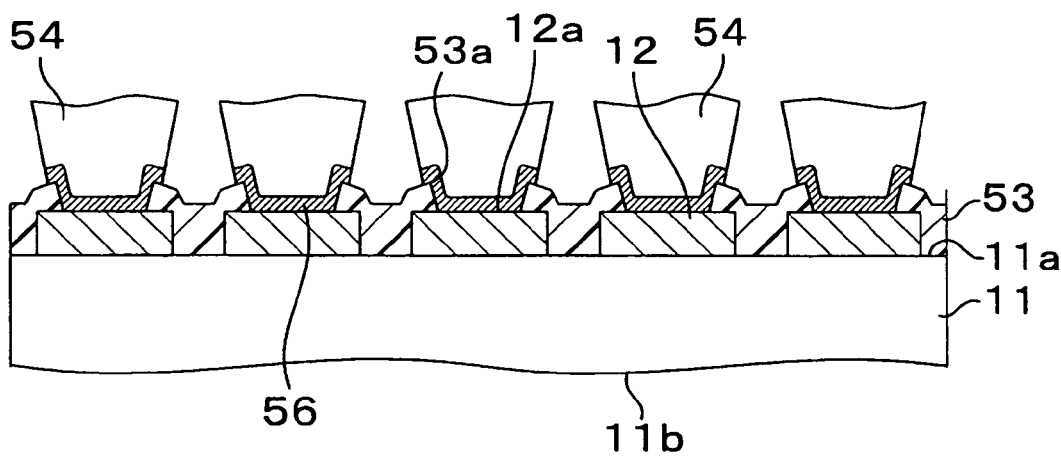

Thereafter, as shown in FIG. 9B, after the photoresist film 57 is removed, the barrier seed layer 56 bared on the surface of the protective film 53 is removed according to the etching method.

Figure 10:
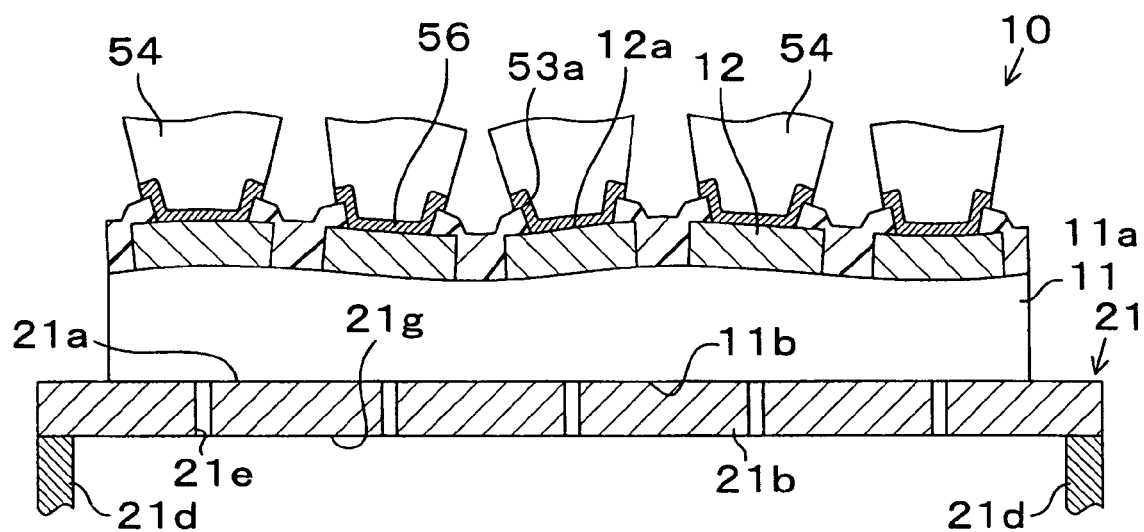
FIG. 10 shows a step included in the metallic electrode forming method of the second embodiment.

Thereafter, as shown in FIG. 10, the semiconductor substrate 11 is placed on the adsorption surface 21*a* of the adsorption stage 21*b* of the surface shape control unit 20 (FIG. 5) by way of the back side 11*b* thereof, and then adsorbed or secured. At this time, the back side 11*b* is flattened with adsorptive force generated on the adsorption surface 21*a*. Therefore, the surface portion 11*c* of the semiconductor substrate 11 assumes a surface shape, which has large irregularities, while reflecting the original irregular shape of the back side 11*b*. Herein, the surface portion 11*c* refers to the surface portion of the Au electrode film 54.

Figure 11A:
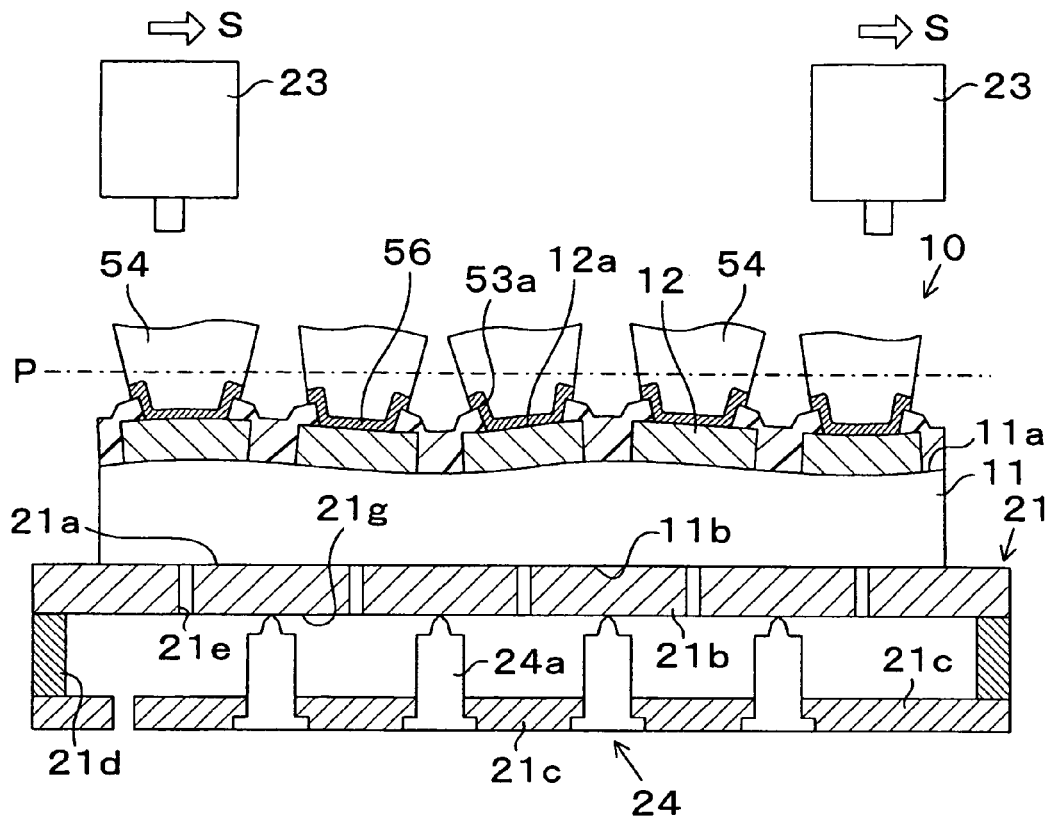
FIG. 11A and FIG. 11B show steps included in the metallic electrode forming method of the second embodiment.

At the succeeding step, as shown in FIG. 11A, the surface shape of the surface portion 11*c* of the semiconductor substrate 11 is measured using the surface shape measurement unit 23. Herein, measurement points are designated in the form of a lattice on the surface portion 11*c* of the semiconductor substrate 11. The surface shape measurement unit 23 is swept along a plane parallel to the cutting plane P in order to measure the thickness of the semiconductor substrate 11. Measurement data items acquired at the respective points are outputted to the control computer 25. The control computer 25 interpolates data items of points among the measurement points on the basis of the measurement data items acquired at the respective measurement points, and thus constructs surface shape data of the surface portion 11*c* of the semiconductor substrate 11.

Figure 11B:
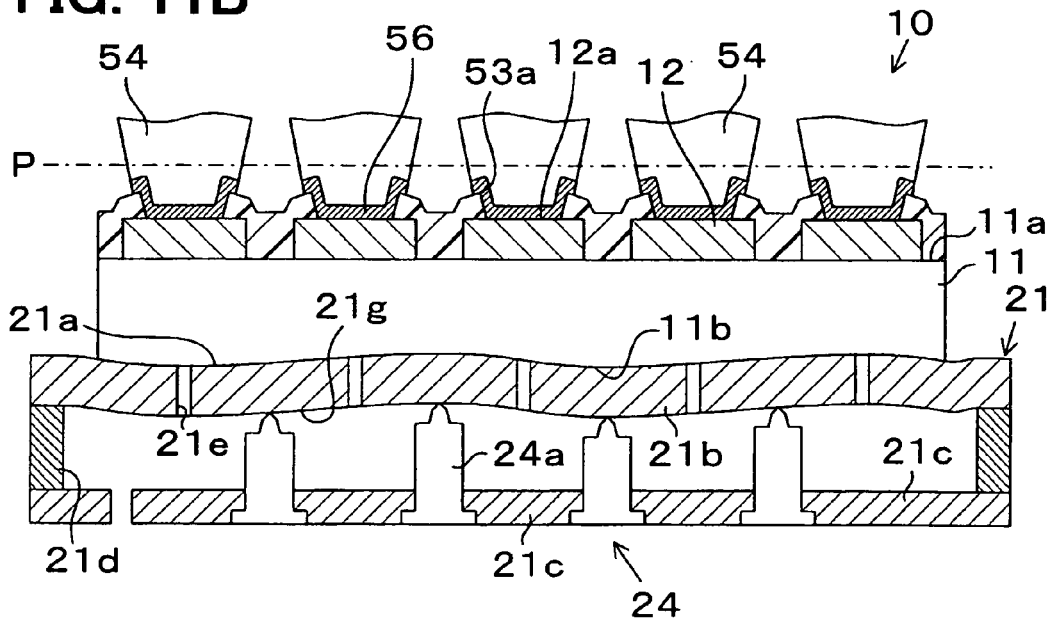

Thereafter, as shown in FIG. 11B, the deformation unit 24 applies displacements to the back size 11*b* of the semiconductor substrate 11 so as to deform the semiconductor substrate 11 so that a variance in the distance between the cutting plane P designated in parallel with the adsorption stage 21*b* and the surface portion 11*c* will fall below a requested degrees of precision in cutting work to be described later. Thus, the surface shape is controlled. In other words, the semiconductor substrate 11 is deformed so that the difference between concave and convex parts of the surface portion 11*c* will fall below the requested degree of precision in cutting work.

To be more specific, the control computer 25 controls the magnitudes of displacements generated by the respective piezoelectric actuators 24*a* of the deformation unit 24 on the basis of the surface shape data constructed by the control computer 25 so that the difference between concave and convex parts of the surface portion 11*c* will fall below the requested degree of precision, for example, 1 μm. Thus, the displacements are applied to the back side 11*b* of the semiconductor substrate 11 via the adsorption stage 12*b*.

Thereafter, the surface shape measurement unit 23 is used to measure the surface shape of the surface portion 11c of the deformed semiconductor substrate 11. The control computer 25 decides whether the variance in the distance between the cutting plane P and surface portion 11c falls below the requested degree of precision in cutting work. Herein, a decision is made on whether the difference between concave and convex parts of the surface portion 11c falls below 1 μm.

Figure 12A:
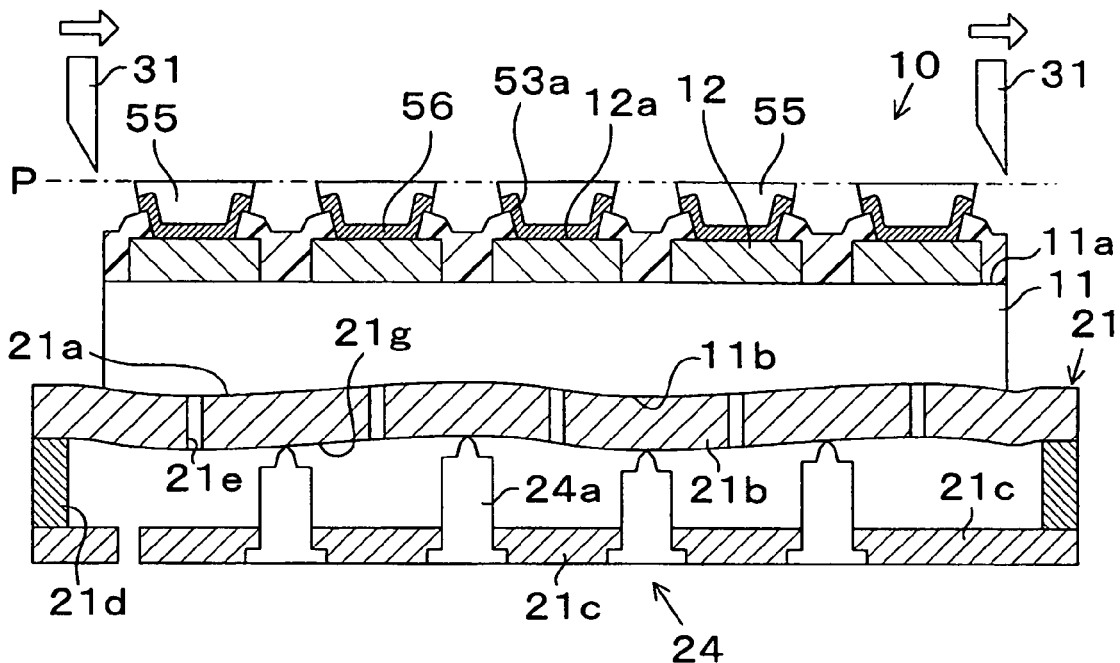
FIG. 12A and FIG. 12B show steps included in the metallic electrode forming method of the second embodiment.

If the control computer 25 decides that the variance in the distance between the cutting plane P and surface portion 11c falls below the requested degree of precision in cutting work, the cutting tool 31 is, as shown in FIG. 12A, used to perform cutting work on the surface of the Au electrode film 54 so as to form the metallic electrodes 55.

Figure 12B:
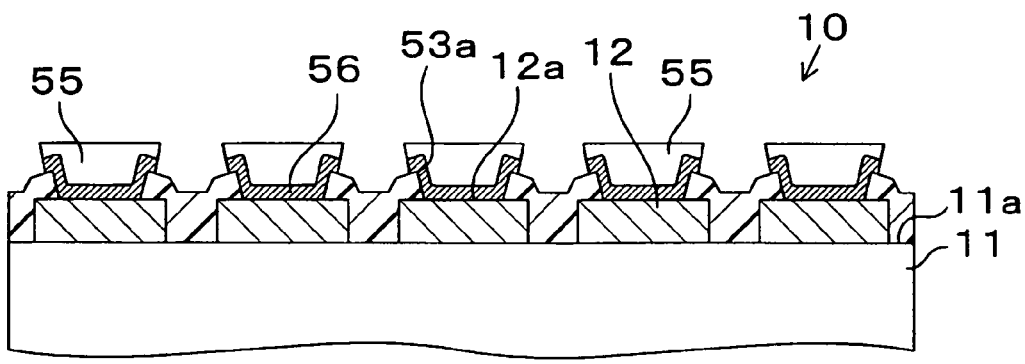

As shown in FIG. 12B, the semiconductor substrate 11 is released from the displacements generated by the piezoelectric actuators 24a, and detached from the stage 21. Consequently, the metallic electrodes 55 are formed on the semiconductor substrate 11.

According to the foregoing steps, since cutting work is performed on the entire principal side 11a of the semiconductor substrate 11, the metallic electrodes 55 having flat surfaces can be formed.

Moreover, when the semiconductor substrate 11 is adsorbed or secured to the adsorption stage 21b, although the difference between concave and convex parts of the surface portion 11c increases while reflecting the shape of the back side 11b, the difference between concave and convex parts of the surface portion 11c can be decreased. Moreover, the distance between the cutting plane P and surface portion 11c can be confined to the predetermined range (set to the requested degree of precision in work). Consequently, the precision in cutting work can be improved. Eventually, a product yield in formation of metallic electrodes can be improved.

Since cutting work is performed on the entire principal side 11a of the semiconductor substrate 11, the metallic electrodes 55 having flat surfaces can be formed.

Moreover, when the semiconductor substrate is adsorbed or secured to the adsorption stage 21b, although the difference between concave and convex parts of the surface portion 11c increases while reflecting the shape of the back side 11b, the difference between concave and convex parts of the surface portion 11c can be decreased. Moreover, the distance between the cutting plane P and surface portion 11c can be confined to the predetermined range (set to the requested degree of precision in work). Consequently, the precision in cutting work can be improved. Eventually, a product yield in formation of metallic electrodes can be improved.

(Modifications)

In the aforesaid embodiments, the piezoelectric actuators 24a are used as the deformation unit. However, the present invention is not limited to the piezoelectric actuators. Any other device can be adopted as long as the device can control and apply a displacement. For example, an electromagnetic solenoid or a hydraulic actuator may be adopted. Using the component, a larger displacement than the displacement produced by each of the piezoelectric actuators 24a can be applied.

In the aforesaid embodiments, the laser displacement gauge is adopted as the surface shape measurement unit 23. The present invention is not limited to the laser displacement gauge. For example, a surface roughness tester or a gap sensor that detects a distance on the basis of a change in an electrostatic capacity may be adopted.

Moreover, the number of measurement points to be measured using the surface shape measurement unit 23 and the arrangement thereof may be determined arbitrarily but need not be arranged equidistantly. Moreover, for example, when the surface roughness tester is employed, profile data acquired through continuous measurement may be used.

Through holes may be formed in the adsorption stage 21b so that the piezoelectric actuators 24a will be brought into direct contact with a semiconductor substrate in order to apply displacements. Using the component, when displacements are not applied, since the adsorption stage 21b is not intervened, force needed to cause the piezoelectric actuators 24a to generate displacements can be reduced. This means that compact piezoelectric actuators can be used.

In the aforesaid embodiments, the adsorption unit 22 depressurizes the normal-pressure atmosphere in the hollow 21d so as to produce a negative pressure. Alternatively, the hollow 21d may be filled with water, oil, or any other fluid, and the fluid is released to outside the hollow 21d in order to produce the negative pressure. Even when this structure is employed, downward displacements can be applied to the semiconductor substrate 11 using the negative pressure.

Third Embodiment

Referring to the drawings, the third embodiment of a metallic electrode forming method for semiconductor devices in accordance with the present invention will be described below. FIG. 1 is a sectional explanatory view of a semiconductor device having metallic electrodes formed according to the metallic electrode forming method of the third embodiment. FIG. 13A to FIG. 15B show steps included in the metallic electrode forming method. FIG. 16A and FIG. 16B are explanatory views presenting a variant of a method of pouring a filler for formation of a flat portion.

A semiconductor device 10 adapted to a power card or the like is formed using a semiconductor substrate 11, which is made of silicon or the like, as a body. Bed electrodes 12 that are element electrodes are formed on the principal side 11a of the semiconductor substrate 11 using pure aluminum (Al) or an aluminum alloy such as an aluminum-silicon (Al—Si) alloy or an aluminum-silicon-copper (Al—Si—Cu) alloy.

A protective film 13 made of an insulating material is formed to cover both the principal side 11a and part of each of the bed electrodes 12. The protective film 13 is made of, for example, a polyimide resin whose thickness ranges from 1 to 20 μm.

Openings 13a through which the bed electrodes 12 are bared are formed in the protective film 13 from the surface of the protective film toward the bed electrodes 12.

A level difference is created so that the surfaces 12a of the bed electrodes 12 bared through the openings 13a will recede from the top 13b of the protective film 13.

Metallic electrodes 15 to which wires are coupled are formed to cover the surfaces 12a of the bed electrodes 12 bared through the respective openings 13a. The metallic electrodes 15 are formed using a titan (Ti)-nickel (Ni)-gold (Au) laminate or a Ni—Au laminate whose components are layered in that order on the sides of the bed electrodes 12, and are electrically connected to the respective bed electrodes 12.

Next, a method of forming the metallic electrodes 15 will be described below.

Figure 13A:
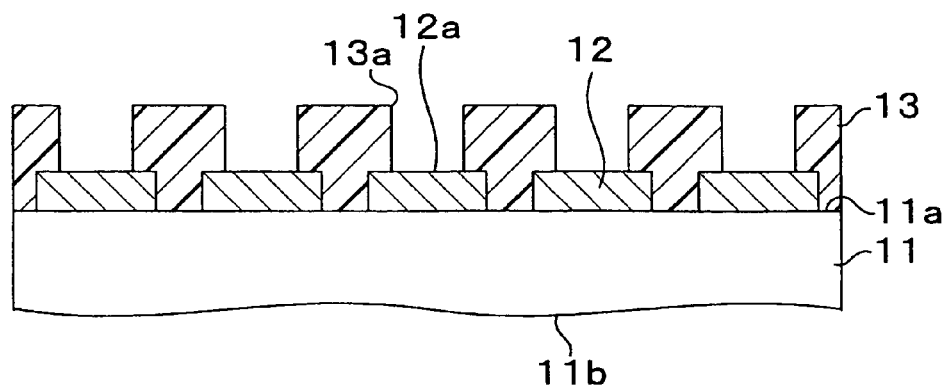
FIG. 13A to FIG. 13C show steps included in the metallic electrode forming method of a third embodiment.

To begin with, as shown in FIG. 13A, the semiconductor substrate 11 having semiconductor elements, which are not shown, formed therein is prepared, and patterned according to a photolithography method in order to form the bed electrodes 12, which are electrically connected to the semiconductor elements, on the principal side 11a thereof.

Thereafter, the protective film 13 having a thickness of, for example, 10 μm and being made of a polyimide resin is formed according to a spin coat method or the like. The openings 13a through which the bed electrodes 12 are bared are formed from the surface of the protective film toward the bed electrodes 12 according to a photolithography method.

A level difference is created so that the surfaces 12a of the bed electrodes 12 bared through the openings 13a will recede from the top 13b of the protective film 13.

Figure 13B:
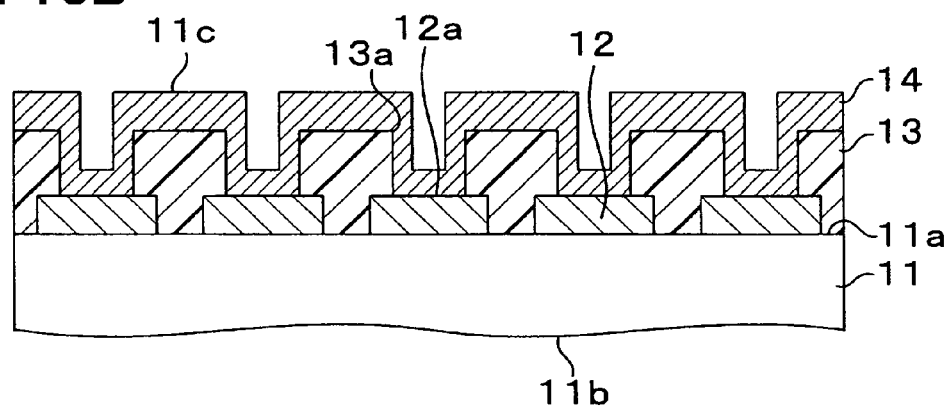

Thereafter, as shown in FIG. 13B, a metallic film 14 is formed to cover both the bed electrodes 12 and the protective film 13 according to a plating method or sputtering method. The metallic film 14 may be a laminate such as a Ti—Ni—Au laminate or a Ni—Au laminate or may be a uni-laminar metallic film.

Figure 13C:
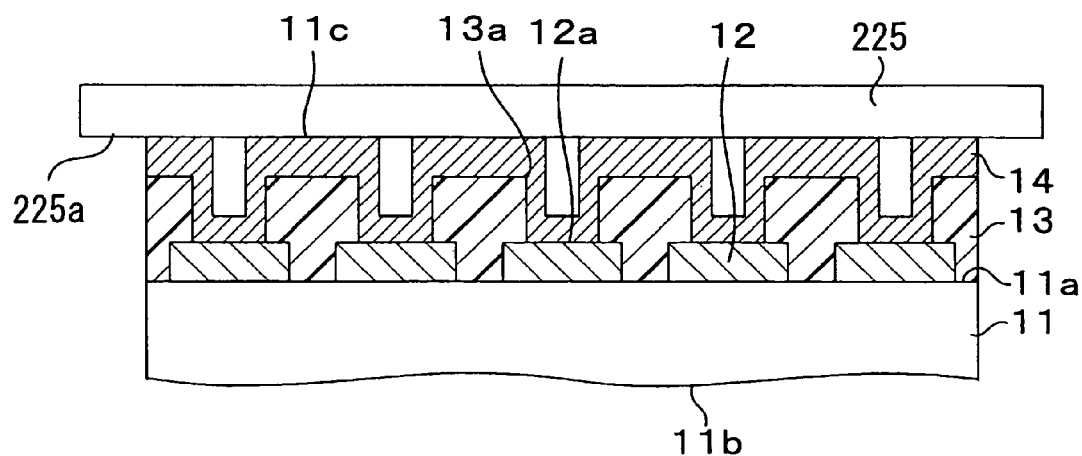

Thereafter, as shown in FIG. 13C, the surface portion 11c of the semiconductor substrate 11 is adsorbed or secured to a surface adsorption stage 225 having an adsorption surface 225a that is flattened. At this time, the flatness of the surface portion 11c is improved owing to adsorptive force induced on the adsorption surface 225a.

Now, the surface portion 11c refers to a portion of the metallic film 14 covering the protective film 13.

Figure 14A:
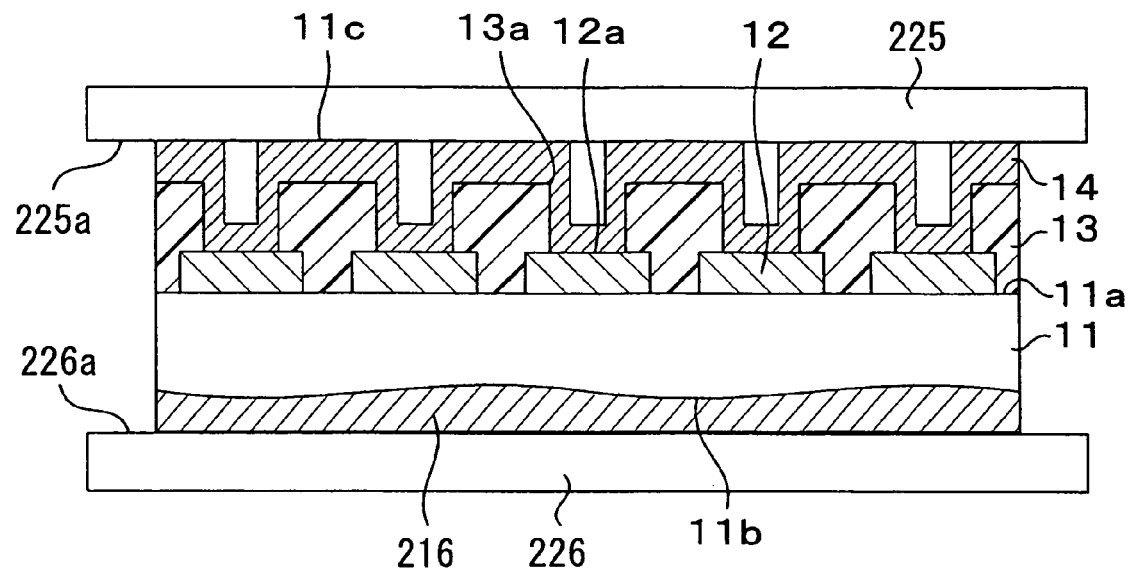
FIG. 14A and FIG. 14B show steps included in the metallic electrode forming method of the third embodiment.

Thereafter, as shown in FIG. 14A, a flattening stage 226 having a flattened reference surface 226a is prepared, and disposed so that the reference surface 226a will be parallel to the adsorption surface 225a of the surface adsorption stage 225. A filler is poured from an end of the back side 11b into a gap between the reference surface 226a and the back side 11b, and cured in order to form a flat portion 216 whose lower surface is flat.

As the filler, a material exhibiting fluidity when being heated, for example, a thermoplastic resin such as polycarbonate is preferably adopted. When such a filler is employed, while the filler is heated to exhibit fluidity, it is poured into the gap. Once the filler is cooled, it is cured. Consequently, the flat portion 216 can be readily formed.

Moreover, the gap between the reference surface 226a and the back side 11b should merely have a space permitting a resin to flow into the gap so as to bury or flatten the irregularities of the back side 11b, and is designated to fall below, for example, 1 mm.

Figure 14B:
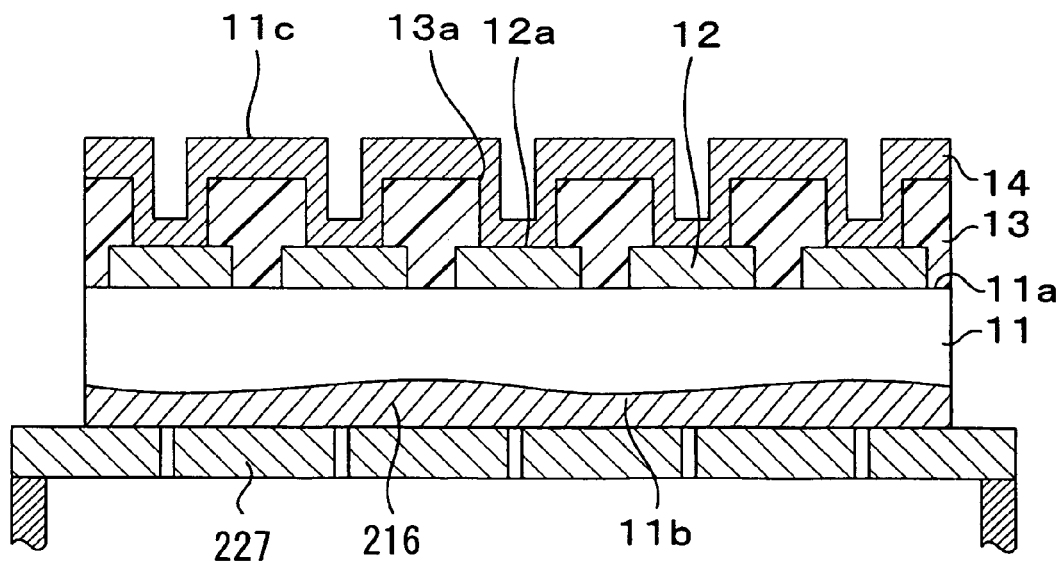

Thereafter, as shown in FIG. 14B, both the surface adsorption stage 225 and flattening stage 226 are detached from the semiconductor substrate 11. The semiconductor substrate 11 is adsorbed or secured to a back side adsorption stage 227 by way of the flat portion 216 formed on the back side 11b of the semiconductor substrate 11.

Figure 15A:
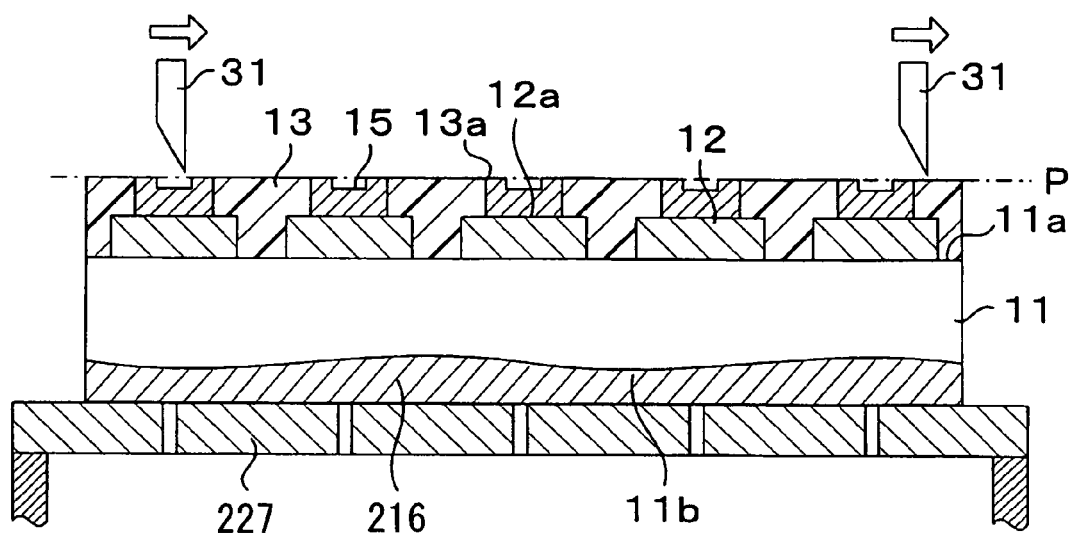
FIG. 15A and FIG. 15B show steps included in the metallic electrode forming method of the third embodiment.
Figure 16A:
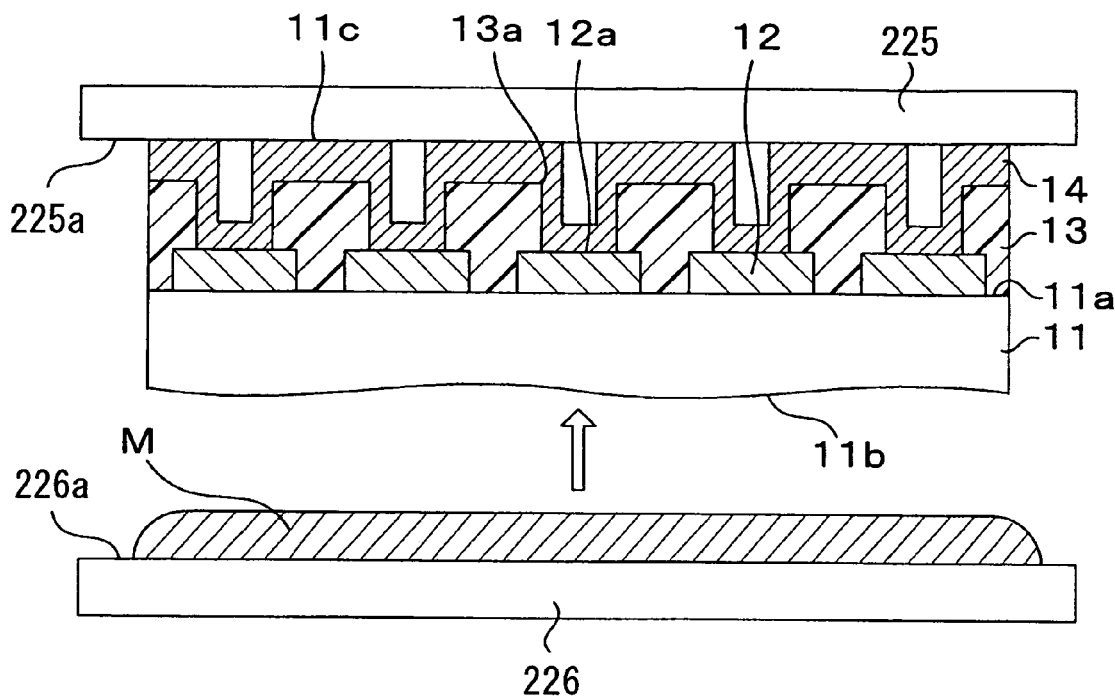
FIG. 16A and FIG. 16B are explanatory views concerning a variant of a method of pouring a filler so as to form a flat portion.
Figure 16B:
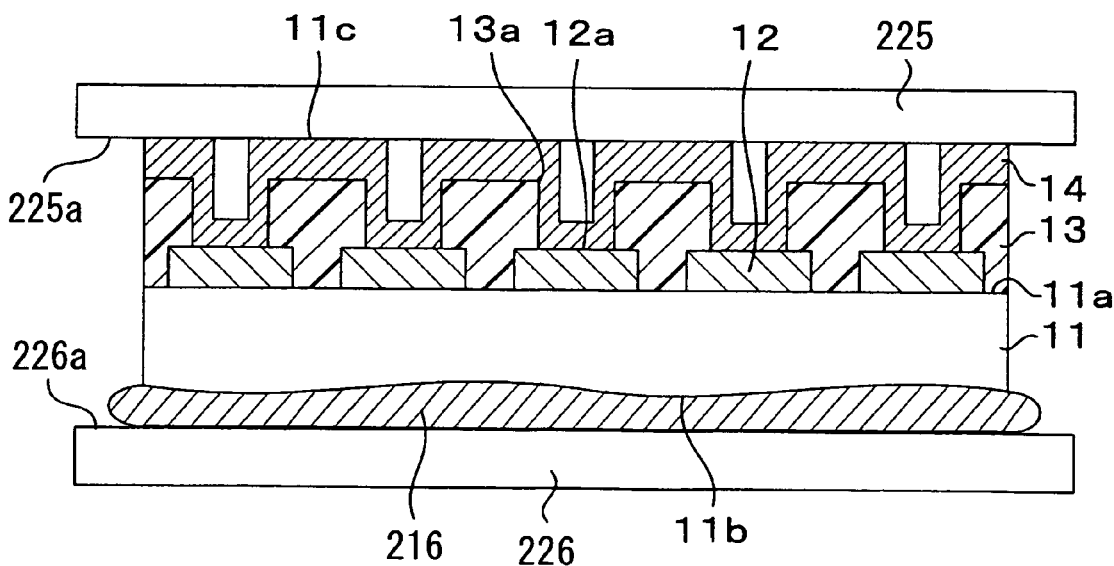

Thereafter, as shown in FIG. 15A, a cutting tool 31 is used to perform cutting work on the surface of the metallic film 14 along a cutting plane P designated in parallel with the back side adsorption stage 227. The metallic film 14 is thus patterned in order to form metallic electrodes 15.

In the present embodiment, the relative speed between the cutting tool 31 and semiconductor device 10 is set to 20 m/s, and a pitch for cutting work is set to 70 μm. Moreover, the degree of precision in the bite of the cutting tool 31 relative to the height of the metallic film 14 is 0.1 μm or less.

Cutting work is performed on all over the principal side 11a of the semiconductor substrate 11 under the above cutting conditions, whereby the metallic film 14 is patterned so that the metallic film will be removed from the top 13b of the protective film 13 and will remain intact inside the openings 13a. Consequently, the metallic electrodes 15 are formed.

Figure 15B:
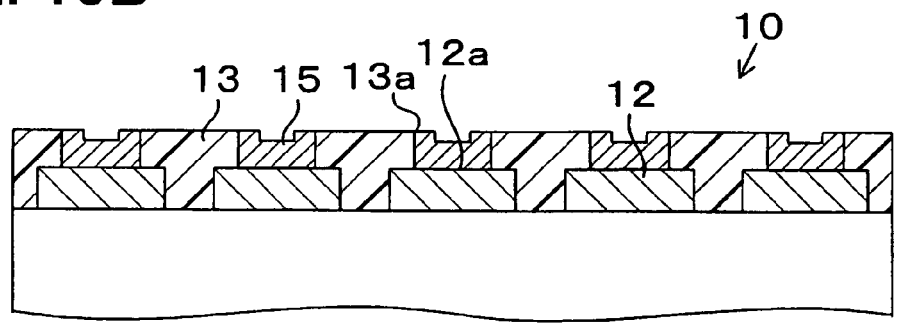

As shown in FIG. 15B, the semiconductor substrate 11 is detached from the back side adsorption stage 227, and the flat portion 11b is removed by performing heating or applying a solvent. Consequently, the metallic electrodes 15 are formed on the semiconductor device 11.

According to the foregoing steps, cutting work is performed on all over the principal side 11a of the semiconductor substrate 11 in order to pattern the metallic film 14 so that the metallic film 14 will be removed from the top of the protective film 13 and will remain intact in side the openings 13a. Consequently, the metallic electrodes 15 are formed.

Moreover, the flat portion 216 that flattens the irregularities of the back side 11b is formed on the back side 11b with the surface portion 11c flattened by the surface adsorption stage 225. Therefore, the flatness of the surface portion 11c is improved. Moreover, even when the semiconductor substrate 11 is adsorbed or secured to the back side adsorption stage 227, the surface portion 11c will not be shaped to have large irregularities while reflecting the original irregular shape of the back side 11b.

Namely, the difference between concave and convex parts of the surface portion 11c is decreased, and the distance between the cutting plane P and the surface portion 11c is confined to a predetermined range (set to a requested degree of precision in work). Consequently, since the precision in cutting work can be improved, a product yield in formation of metallic electrodes can be improved.

As the filler to be used to form the flat portion 216, aside from a resin, a low-fusing point material such as wax, solder, or an indium alloy may be adopted.

The flattening stage 226 may be made of a transparent material, for example, a glass or acrylic, and a photo-curing resin may be adopted as the filler. When these materials are employed, after the photo-curing resin is poured into the gap, ultraviolet rays are irradiated to the lower surface of the flattening stage 226 in order to cure the photo-curing resin. Thus, the flat portion 216 may be formed.

Pouring of the filler is not limited to the method described with reference to FIG. 14A. For example, first, the filler may be, as shown in FIG. 16A, applied to the reference surface 226a of the flattening stage 226. The flattening stage may then be, as shown in FIG. 16B, pressed against the back side 11b. Thus, the filler may be poured into the gap. In this case, for example, even when a material that is too viscous to readily invade into the gap is employed, the filler can be reliably poured into the gap.

At a cutting step shown in FIG. 15A, the flattening stage 226 may not be detached from the semiconductor substrate 11, but the semiconductor substrate 11 may be adsorbed or secured together with the flattening stage 226 and then subjected to cutting work. Moreover, the flat portion 216 may not be removed as long as it will not adversely affect the operation of the semiconductor device 10.

The bed electrodes 12 electrically connected to semiconductor elements are formed on the principal side 11a of the semiconductor substrate 11. The protective film 13 is formed over the bed electrodes 12, and the openings 13a through which the bed electrodes 12 are bared are formed from the surface of the protective film 13 toward the bed electrodes 12. The metallic film 14 is formed to cover both the protective film 13 and the surfaces of the bed electrodes 12 bared through the openings 13a. The metallic electrodes 15 are formed by patterning the metallic film 14 through cutting work, in which cutting is performed on the cutting plane P, so that only the portion of the metallic film 14 formed inside the openings 13a will remain intact.

Moreover, the flat portion 216 to be used to flatten the irregularities of the back side 11b is formed on the back side 11b with the surface portion 11c flattened by the surface adsorption stage 225. Consequently, the flatness of the surface portion 11c is improved. Moreover, even when the semiconductor substrate 11 is adsorbed or secured to the back side adsorption stage 227, the surface portion 11c will not be shaped to have large irregularities while reflecting the original irregular shape of the back side 11b.

Namely, the difference between concave and convex parts of the surface portion 11c is decreased, and the distance between the cutting plane P and surface portion 11c is confined to the predetermined range (set to the requested degree of precision in work). Consequently, since the precision in cutting work can be improved, the product yield in formation of metallic electrodes can be improved.

As the filler, a material that exhibits fluidity when being heated, for example, a thermoplastic resin such as polycarbonate is adopted. Therefore, while the filler is heated to exhibit fluidity, it is poured into the gap. Once the filler is cooled, it is cured. Consequently, the flat portion 216 can be readily formed.

At the step of forming the flat portion 216, a method of applying the filler to the reference surface 226a of the flattening stage 226, and pressing the flattening stage against the back side 11b may be adopted in order to pour the filler to the gap. In this case, even when a material that is too viscous to readily invade into the gap is adopted, the filler can be reliably poured into the gap between the reference surface 226a and the back side 11b.

Fourth Embodiment

Figure 17A:
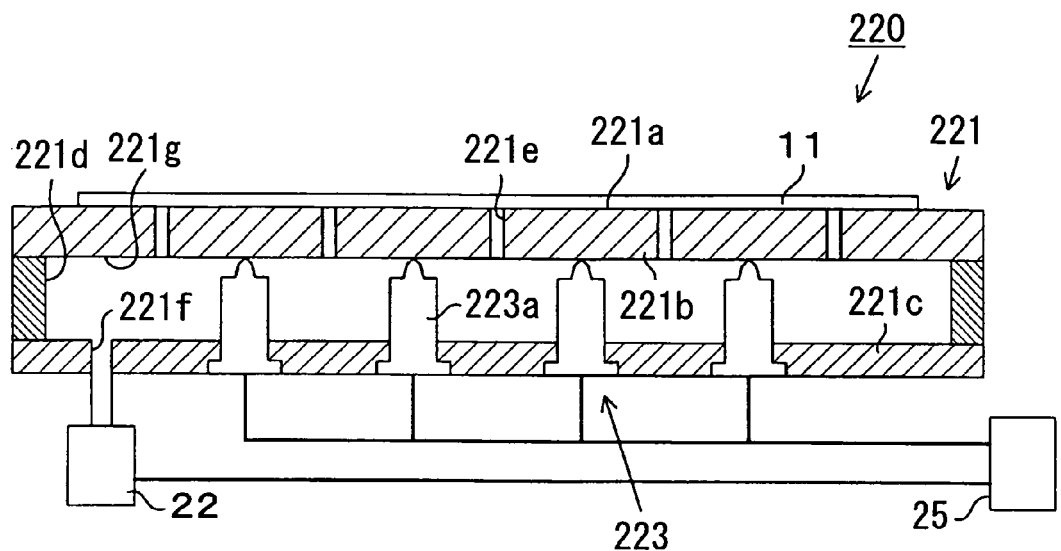
FIG. 17A and FIG. 17B are explanatory views of a displacement control adsorption apparatus employed in a metallic electrode forming method of a fourth embodiment.
Figure 17B:
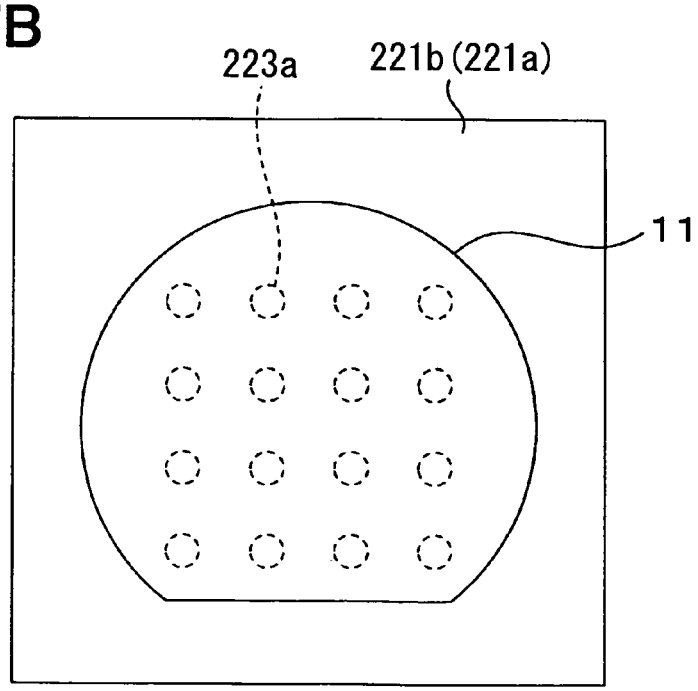
Figure 18A:
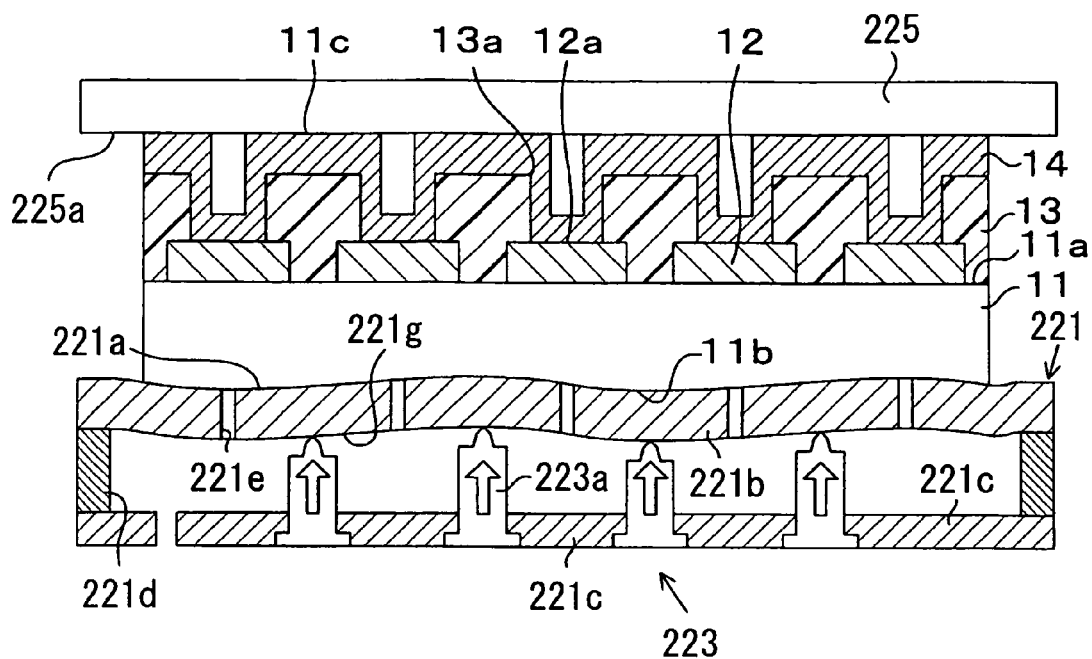
FIG. 18A and FIG. 18B show steps included in the metallic electrode forming method of the fourth embodiment.

The fourth embodiment of a metallic electrode forming method for semiconductor devices in accordance with the present invention will be described with reference to drawings. FIG. 17A and FIG. 17B are explanatory views of a displacement control adsorption apparatus employed in the metallic electrode forming method of the fourth embodiment. FIG. 17A is a sectional view, and FIG. 17B is a plan explanatory view of the displacement control adsorption apparatus seen from a semiconductor substrate side. FIG. 18A and FIG. 19B show steps included in the metallic electrode forming method of the fourth embodiment.

A displacement control adsorption apparatus 220 employed in the metallic electrode forming method of the fourth embodiment will be described below with reference to FIG. 17A and FIG. 17B.

The displacement control adsorption apparatus 220 includes a stage 221 on which the semiconductor substrate 11 is placed, an adsorption unit 22 that adsorbs or secures the semiconductor substrate 11, a displacement unit 223 that applies displacements to the back side 11b of the semiconductor substrate 11 by way of the back side 11b of the semiconductor substrate 11, and a control computer 25 that controls these units.

The stage 221 has a hollowed shape and includes a hollow 221d interposed between the adsorption stage 221b and a lower stage 221c. The adsorption stage 221b includes an adsorption surface 221a that adsorbs or secures the semiconductor substrate 11, and adsorption holes 221e through which adsorptive force that is generated by depressurizing the hollow 221d using the adsorption unit 22 such as a vacuum pump reacts on the semiconductor substrate 11.

The adsorption stage 221b is formed to be easily deformable in order to apply displacements, which are generated by the displacement unit 223, to the semiconductor substrate 11. Herein, the adsorption stage 221b is formed with a stainless steel plate having a thickness of 1 mm.

A depressurization hole 221f through which the adsorption unit 22 is connected and the displacement unit 223 are formed in or disposed on the lower stage 221c.

In the present embodiment, multiple piezoelectric actuators 223a are adopted as the displacement unit 223. The piezoelectric actuators 223a are arranged in the form of a lattice with a predetermined space, for example, a space of 1 cm between adjoining ones. The piezoelectric actuators 223a are abutted on the back side 221g of the adsorption stage 221b and disposed so that they can generate upward displacements. FIG. 17A and FIG. 17B are concerned with a case where sixteen piezoelectric actuators 223a are, for convenience' sake, arranged in total in four columns and four rows. The piezoelectric actuators 223a can generate mutually different displacements that can be mutually independently controlled by the control computer 25. The displacements generated by the respective piezoelectric actuators 223a can be highly precisely controlled, the backlash made by the piezoelectric actuators 223a is limited, and the amount of heat dissipated from the piezoelectric actuators 223a during operation is small.

The metallic electrode forming method of the fourth embodiment is identical to that of the third embodiment up to the step shown in FIG. 13C. A description will therefore be made of the succeeding steps. Subsequently to the step shown in FIG. 13C, as shown in FIG. 18A, the displacement control adsorption apparatus 220 is prepared, and upward displacements are applied using the piezoelectric actuators 223a of the displacement unit 223 so that the adsorption stage 221b will abut on the back side 11b of the semiconductor substrate 11.

At this time, the control computer 25 monitors the dielectric constants (capacities) of the respective piezoelectric actuators 223a so as to detect whether the adsorption stage 221b abuts on the back side 11b.

Figure 18B:
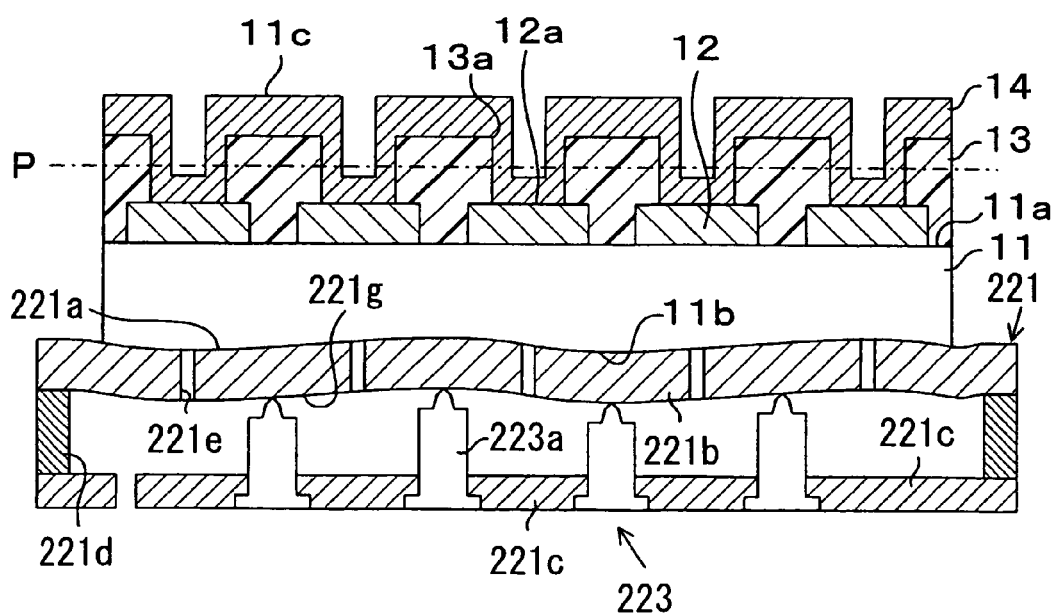

At the next step, as shown in FIG. 18B, while the displacements generated by the piezoelectric actuators 223a of the displacement unit 223 are sustained, the semiconductor substrate 11 is adsorbed or secured to the adsorption stage 221b. The surface adsorption stage 225 is detached.

At this time, based on the dielectric constants (capacities) of the piezoelectric actuators 223a detected by the control computer 25, voltages for sustaining the displacements are applied to the respective piezoelectric actuators 223a. Thus, the displacements are sustained.

Figure 19A:
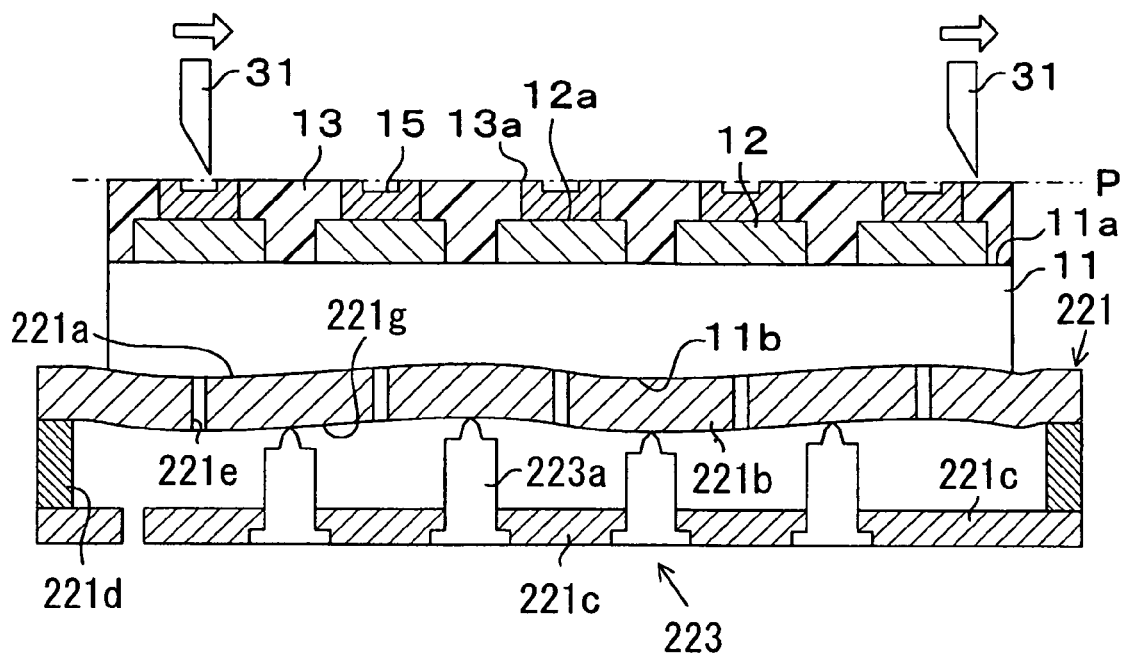
FIG. 19A and FIG. 19B show steps included in the metallic electrode forming method of the fourth embodiment.
Figure 19B:
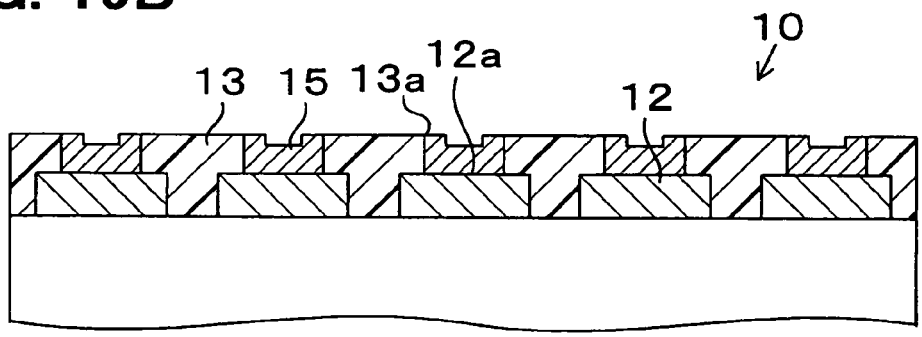

Thereafter, as shown in FIG. 19A, the cutting tool 31 is used to perform cutting work on the surface of the metallic film 14 along the cutting plane P designated in parallel with the adsorption stage 221b. The metallic film 14 is thus patterned in order to form the metallic electrodes 15.

As shown in FIG. 19B, the semiconductor substrate 11 is released from the displacements generated by the piezoelectric actuators 223a, and detached from the stage 221. Thus, the metallic electrodes 15 are formed on the semiconductor substrate 11.

According to the foregoing steps, displacements are applied to the back side 11b of the semiconductor substrate 11 by the piezoelectric actuators 223a in order to sustain the state of the surface portion 11c flattened by the surface adsorption stage 225. When the semiconductor substrate 11 is adsorbed or secured to the adsorption stage 221b, the displacements can be sustained.

Consequently, the flatness of the surface portion 11c is improved. Moreover, even when the semiconductor substrate 11 is adsorbed or secured to the adsorption stage 221b, the surface portion 11c will not be shaped to have large irregularities while reflecting the original irregular shape of the back side 11b.

Namely, the difference between concave and convex parts of the surface portion 11c is decreased, and the distance between the cutting plane P and surface portion 11c is confined to a predetermined range (set to a requested degree of precision in work). Consequently, since the precision in cutting work can be improved, the product yield in formation of metallic electrodes can be improved.

In the foregoing embodiment, the piezoelectric actuators 223a are adopted as the displacement unit. The present invention is not limited to the piezoelectric actuators. For example, an electromagnetic solenoid, a hydraulic actuator, or any other device may be adopted as long as the device can apply a controllable displacement. The device can generate a larger displacement than the piezoelectric actuator 223a can.

Through holes may be formed in the adsorption stage 221b so that the piezoelectric actuators 223a will come into direct contact with a semiconductor substrate so as to apply displacements thereto. Using this structure, when the displacements are applied, since the adsorption stage 221b is not intervened, force necessary for the piezoelectric actuators 223a to generate displacements can be reduced. Consequently, compact piezoelectric actuators can be employed.

Displacements are applied to the back side 11b of the semiconductor substrate 11 by the piezoelectric actuators 223a in order to sustain the state of the surface portion 11c flattened by the surface adsorption stage 225. When the semiconductor substrate 11 is adsorbed or secured to the adsorption stage 221b, the displacements can be sustained.

Consequently, the flatness of the surface portion 11c is improved. Even when the semiconductor substrate 11 is adsorbed or secured to the adsorption stage 221b, the surface portion 11c will not be shaped to have large irregularities while reflecting the original irregular shape of the back side 11b.

Namely, the difference between concave and convex parts of the surface portion 11c is decreased, and the distance between the cutting plane P and surface portion 11c is confined to a predetermined range (set to a requested degree of precision in work). Consequently, since the precision in cutting work can be improved, the product yield in formation of metallic electrodes can be improved.

Since the displacement unit 223 includes multiple piezoelectric actuators 223a that generate controllable displacements, different displacements can be applied to the adsorption stage 221b according to the shape of the back side 11b of the semiconductor substrate 11. Therefore, the adsorption stage 221b can be highly precisely abutted on the back side 11b according to the shape of the back side 11b. Moreover, the displacements generated by the piezoelectric actuators 223a can be highly precisely controlled, the backlash made thereby is limited, and the amount of heat dissipated therefrom during operation is small.

Fifth Embodiment

Referring to the drawings, the fifth embodiment of a metallic electrode forming method for semiconductor devices in accordance with the present invention will be described below.

Figure 20A:
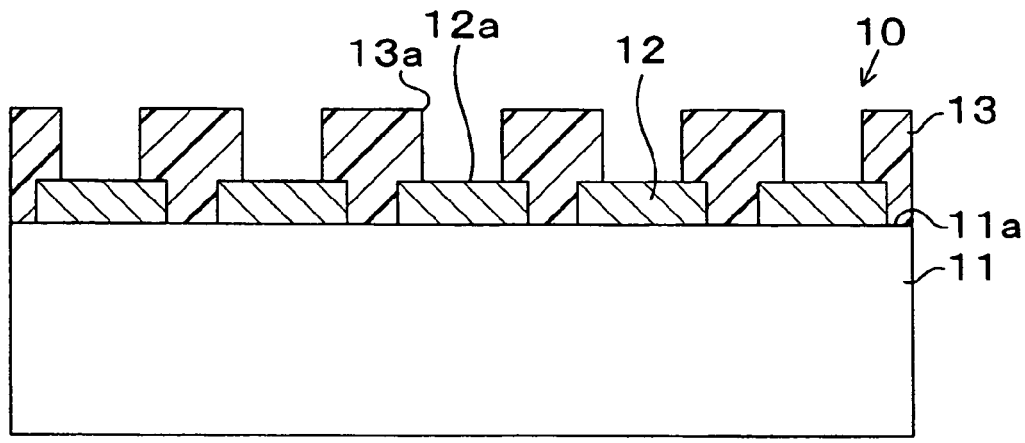
FIG. 20A to FIG. 20C show steps included in a metallic electrode forming method according to a fifth embodiment.
Figure 20B:
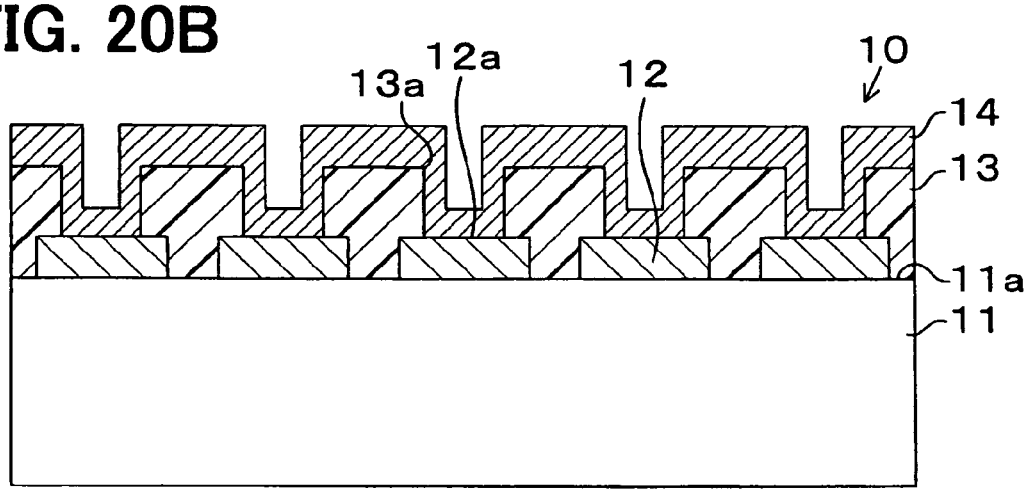
Figure 20C:
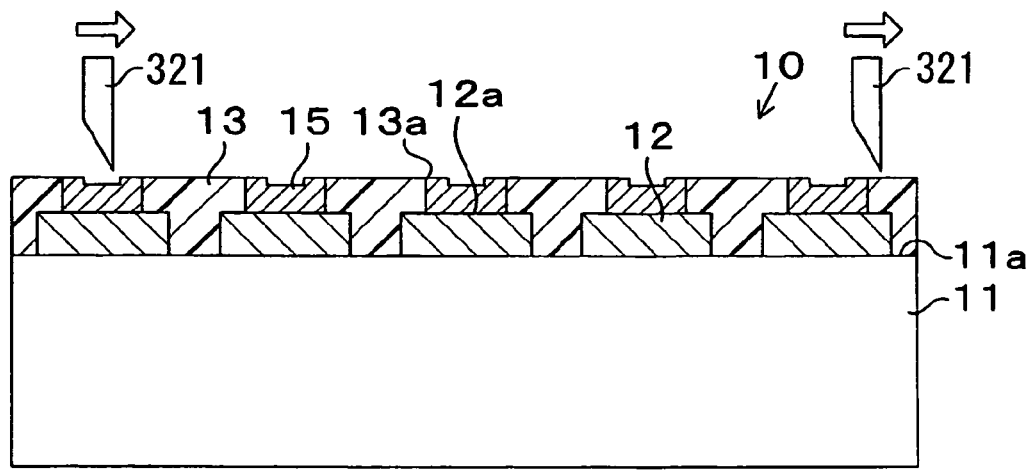
Figure 21:
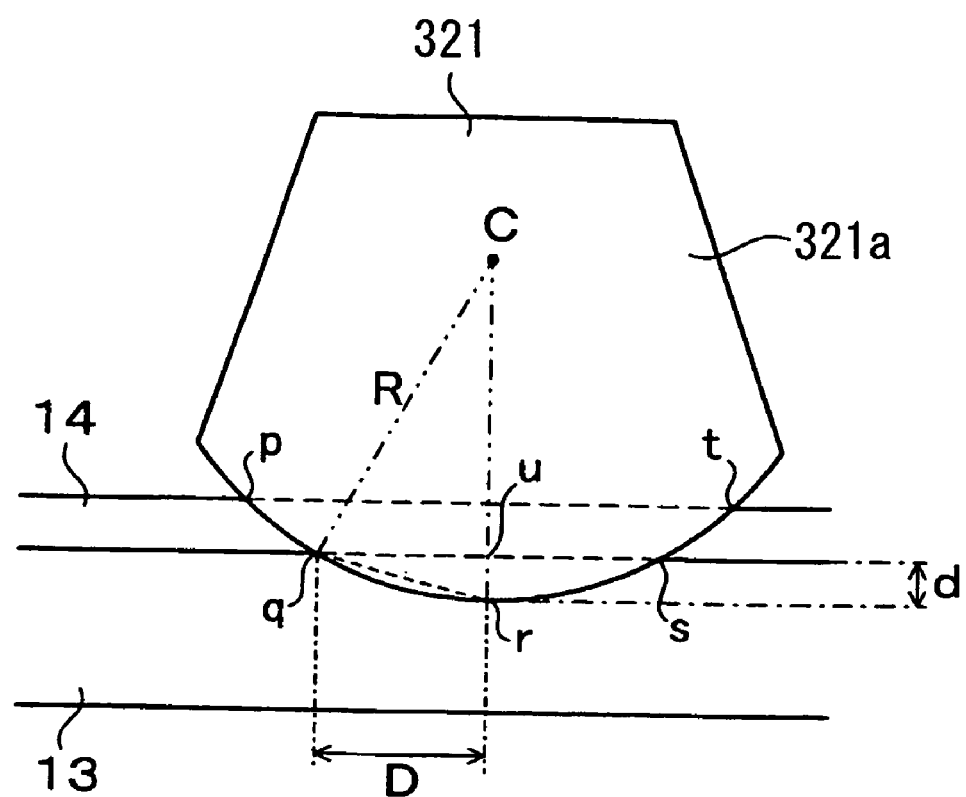
FIG. 21 is a sectional explanatory diagram of the states of a metallic electrode and a protective film cut by a cutting tool.
Figure 22A:
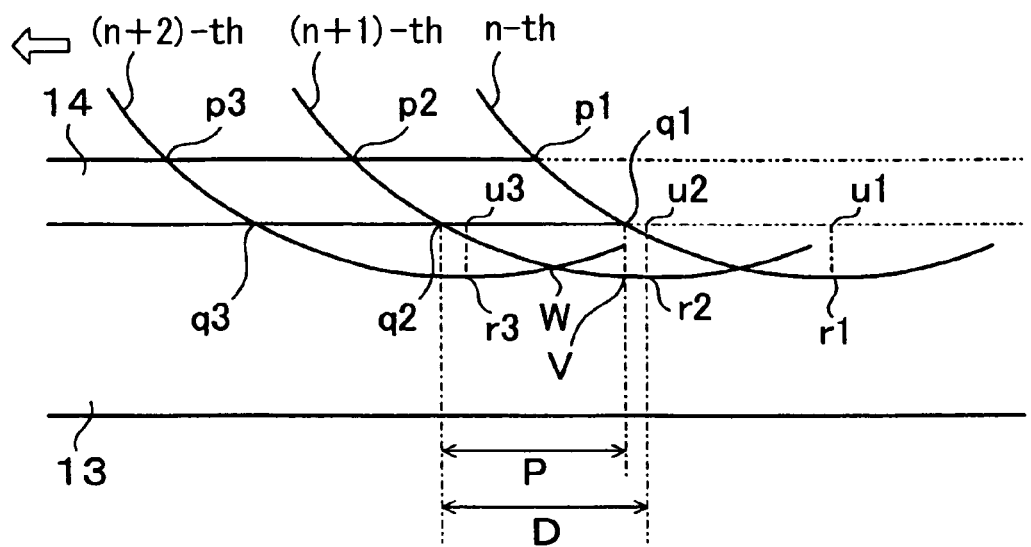
FIG. 22A and FIG. 22B are sectional explanatory diagrams concerning a relationship between a cutting pitch and the cut state of the protective film.
Figure 22B:
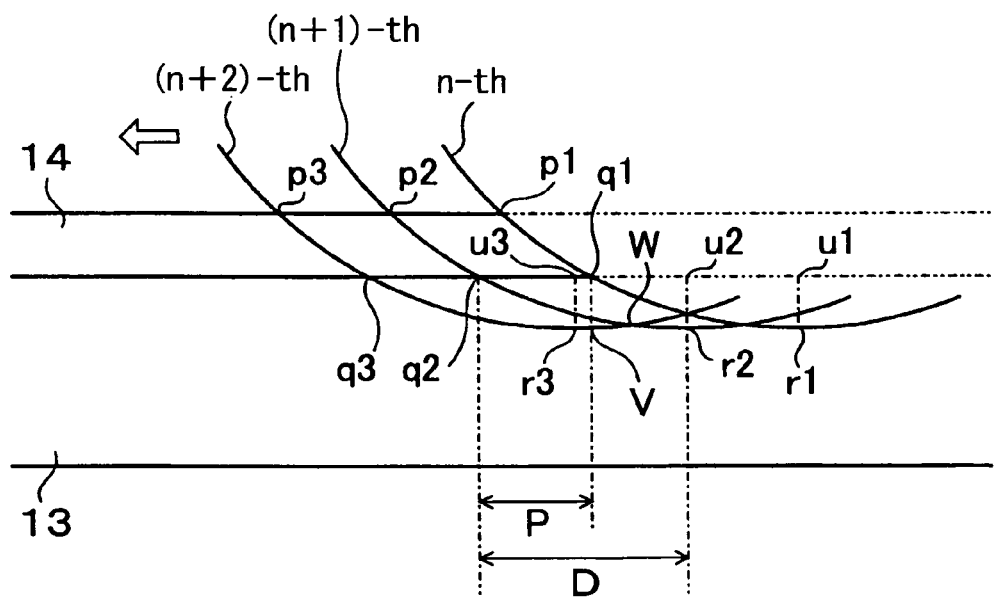
Figure 23:
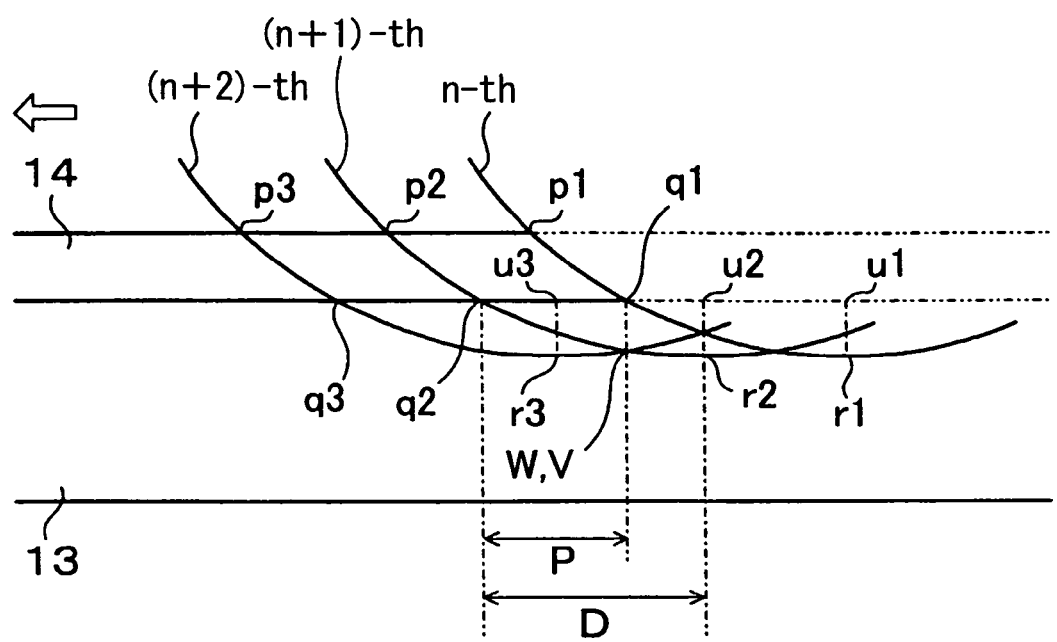
FIG. 23 is a sectional explanatory diagram concerning a way of determining a condition of a cutting pitch making it possible to diminish the surface roughness of the protective film that has undergone cutting work.

FIG. 1 is a sectional explanatory view of a semiconductor device having metallic electrodes formed according to the metallic electrode forming method in accordance with the fifth embodiment. FIG. 20A to FIG. 20C show steps included in the metallic electrode forming method. FIG. 21 is a sectional explanatory diagram of the states of a metallic electrode and a protective film cut by a cutting tool. FIG. 22A and FIG. 22B are sectional explanatory diagrams concerning the relationship between a cutting pitch and the cut state of the protective film. FIG. 23 is a sectional explanatory diagram concerning a way of determining a condition of a cutting pitch that makes it possible to diminish the surface roughness of the protective film having undergone cutting work.

A semiconductor device 10 adapted to a power card or the like is formed using a semiconductor substrate 11, which is made of silicon or the like, as a body. Bed electrodes 12 that are element electrodes are formed on the substrate side 11a (i.e., principal side) of the semiconductor substrate 11 using pure aluminum (Al) or an aluminum alloy such as an aluminum-silicon (Al—Si) alloy or an aluminum-silicon-copper (Al—Si—Cu) alloy.

A protective film 13 made of an insulating material is formed to cover both the substrate side 11a and part of each of the bed electrodes 12. The protective film 13 is made of, for example, a polyimide resin whose thickness ranges from 1 to 20 μm.

Openings 13a through which the bed electrodes 12 are bared are formed in the protective film 13 from the surface of the protective film toward the bed electrodes 12.

A level difference is created so that the surfaces 12a of the bed electrodes 12 bared through the openings 13a will recede from the top 13b of the protective film 13.

Metallic electrodes 15 to which wires are coupled are formed to cover the surfaces 12a of the bed electrodes 12 bared through the respective openings 13a. The metallic electrodes 15 are formed using a titan (Ti)-nickel (Ni)-gold (Au) laminate or a Ni—Au laminate whose components are layered in that order on the sides of the bed electrodes 12, and are electrically connected to the respective bed electrodes 12.

Next, a method of forming the metallic electrodes 15 will be described below.

To begin with, as shown in FIG. 20A, the semiconductor substrate 11 having semiconductor elements, which are not shown, formed therein is prepared, and patterned according to a photolithography method in order to form the bed electrodes 12 that are electrically connected to the semiconductor elements.

Thereafter, the protective film 13 having a thickness of, for example, 10 μm and being made of a polyimide resin is formed according to a spin coat method or the like. The openings 13a through which the bed electrodes 12 are bared are formed from the surface of the protective film toward the bed electrodes 12 according to a photolithography method.

A level difference is created so that the surfaces 12a of the bed electrodes 12 bared through the openings 13a will recede from the top of the protective film 13.

Thereafter, as shown in FIG. 20B, a metallic film 14 is formed to cover both the bed electrodes 12 and the protective film 13 according to a plating method or sputtering method. The metallic film 14 may be a laminate such as a Ti—Ni—Au laminate or a Ni—Au laminate or may be a uni-laminar metallic film.

Thereafter, as shown in FIG. 20C, a cutting tool 321 is used to perform cutting work on the surface of the metallic film 14. The metallic film 14 is thus patterned in order to form metallic electrodes 15.

In the present embodiment, as the cutting tool 321, a straight tool having, as shown in FIG. 21, on the cutting face 321a thereof an edge whose width is 3 mm and whose radius of curvature R (hereinafter, a nose radius R) is 10 mm is adopted.

When a polyimide resin is adopted as the protective film 13, if the protective film 13 alone is cut, as long as the cut depth is 8 μm or less, the resin will not be plucked from the cut plane. Consequently, a smooth cut plane is obtained. On the other hand, once the cut depth exceeds 8 μm, the rigidity of swarf (i.e., cutting chip) increases. Consequently, the resin tends to be plucked and the surface roughness tends to intensify. In the present embodiment, the cut depth is set to 3 µm.

In the present embodiment, the relative speed between the cutting tool 321 and semiconductor device 10 is set to 20 m/s, and a pitch P for cutting work is set to 70 µm. The pitch P can be controlled based on the number of rotations of a spindle and a work feeding speed. For example, when the number of rotations of the spindle is set to 2000 rpm and the work feeding speed is set to 2.3 mm/s, the pitch P is designated to be approximately 70 µm.

Moreover, the degree of precision in the bite of the cutting tool 321 relative to the height of the metallic film 14 is 0.1 µm or less.

Cutting work is performed on all over the substrate side 11a of the semiconductor substrate 11 under the above cutting conditions, whereby the metallic electrodes 15 are formed by patterning the metallic film 14 so that the metallic film will be removed from the top of the protective film 13 and will remain intact inside the openings 13a.

In the metallic electrode forming method of the present embodiment, when an appropriate pitch is designated, the surface roughness of the protective film 13 having undergone cutting work can be diminished. A cutting pitch preventing pluck of the protective film 13 will be described below.

FIG. 21 is a sectional view of the section shown in FIG. 20C. Herein, a description will be made on the assumption that the cutting tool 321 whose distal part has a nose radius R advances forward in the drawing so as to perform cutting work on the protective film 13 by a depth d. A point r is a point where the utmost distal end of the cutting face 321a of the cutting tool 321 reaches after having vertically advanced by a length R from a center of curvature C toward an object of cutting.

Herein, in the present embodiment, since the cutting tool 321 is moved leftward in the drawing (see FIG. 22A and FIG. 22B), the blade portion on the left side of the point r corresponds to the first blade portion, and the blade portion on the right side thereof corresponds to the second blade portion.

The sections of the metallic film 14 and protective film 13 that are cut assume shapes determined by part of an arc which has the nose radius R and is defined by points p, q, r, s, and t. Out of an arc p-q-r-s-t indicating portions of the metallic film and protective film bared by the cutting tool 321, an arc p-q or an arc s-t indicates a bared portion of the metallic film 14, and an arc q-r-s indicates a bared portion of the protective film 13.

Herein, a point on the surface of the protective film 13 where a straight line is vertically extended from the center of curvature C is defined as a point u, and the length of a segment qu is defined as a maximum cut width D of the protective film 13.

Since a triangle Cqu is a right angled triangle whose angle Cuq is a right angle, equations (1) and (2) below are established based on the theorem of three squares.

$$Cq^2 = Cu^2 + qu^2 \quad (1)$$

$$R^2 = (R-d)^2 + D^2 \quad (2)$$

Consequently, the maximum cut width D is expressed by an equation (3) below using the nose radius R and depth d.

$$D = (2Rd - d^2)^{1/2} \quad (3)$$

Next, a condition of a cutting pitch making it possible to diminish the surface roughness of the protective film 13 having undergone cutting work will be described below.

FIG. 22A and FIG. 22B show the states of the protective film 13 and metallic film 14 attained after completions of the n-th to n+2-th cutting works performed using the cutting tool 321 that is moved at intervals of the pitch P leftward in the drawing. FIG. 22A is concerned with a case where the pitch P is large, and FIG. 22B is concerned with a case where the pitch P is small.

In the drawings, segments p1p2, p2p3, q1q2, q2q3, u1u2, and u2u3 represent the pitch P.

As shown in FIG. 22A, after the completion of the n-th cutting, an arc p1-q1 indicates a bared portion of the metallic film 14 and an arc q1-r1 indicates a bared portion of the protective film 13. Namely, the metallic film 14 is left intact on the left side of the point q1.

Thereafter, the cutting tool 321 is moved leftward by the pitch P, and the n+1-th cutting is performed. An arc p2-q2-r2 indicates an area where cutting work is performed by the first blade portion.

Within the area, in an area where the metallic film 14 is layered on the protective film 13, the metallic film 14 restricts deformation of swarf, and the protective film 13 is plucked. Assuming that a point of intersection between a perpendicular extended from the point q1 and an arc q2-r2 is a point v, the area where the protective film 13 is plucked is indicated with an arc q2-v.

On the other hand, when the protective film 13 alone is cut, once an appropriate cutting condition is designated, a smooth cut plane on which a mean of roughness levels at ten points is 0.1 µm or less can be provided.

Consequently, in order to diminish the surface roughness of the protective film 13, the arc q2-v that indicates an area where the surface roughness is intense should be cut during the n+2-th cutting work.

A cut plane to be newly created during the n+2-th cutting work is indicated with an arc p3-q3-r3-w. Within the arc, an arc r3-w indicates an area where cutting work is performed by the second blade portion. The point w is a point of intersection between an arc indicating a cut plane created during the n+1-th cutting work and an arc indicating a cut plane created during the n+2-th cutting. As shown in FIG. 22A, under a condition that the pitch P is large, the point v is located on the right side of the point w.

During the n+1-th cutting work, within an area which is indicated with an arc q2-v and in which the underlying film of the metallic film 14 is plucked to intensify the surface roughness, an area indicated with an arc q2-w is subjected to another cutting work during the n+2-th cutting work. Consequently, the surface roughness of the protective film 13 having undergone cutting work can be diminished.

However, within the arc q2-v, the remaining arc w-v indicates an area where the n+1-th cutting work alone is performed. Consequently, the surface roughness is held intense in the area.

In contrast, as shown in FIG. 22B, when the pitch P is made small and the point v is located on the left side of the point w, the entire area indicated with the arc q2-v is subjected to another cutting work by the second blade portion, which extends on the right side of the point r3, during the n+2-th cutting work. Consequently, an area where the surface roughness of the protective film 13 having undergone cutting work is intense is not left intact.

As shown in FIG. 22B, in order that the entire area indicated with the arc q2-v may be subjected to another cutting work by the second blade portion extending on the right side of the point r3, the point w should lie on the left side of the point v or the points v and w should be squared with each other.

As shown in FIG. 23, when the points v and w are squared with each other, the point q1 serves as a middle point of a segment u2u3. Consequently, equations (4) and (5) below are established.

$$q1q2 = q2u2 - q2q1 \quad (4)$$

$$1/2P = D - P \quad (5)$$

Consequently, when the points v and w are squared with each other, the pitch P is expressed by an equation (6) below using the maximum cut width D.

$$P = 2/3D \quad (6)$$

Consequently, in order that the point w may lie on the left side of the point v or the points v and w may be squared with each other, the pitch P should satisfy the relationship provided by an expression (7) below.

$$0 < P \leq 2/3(2Rd - d^2)^{1/2} \quad (7)$$

Once the pitch P satisfies the relationship provided by the expression (7), the entire area indicated with the arc q2-v is subjected to another cutting work during the n+2-th cutting. Consequently, an area where the surface roughness is intense is not left in the protective film 13 having undergone cutting work. Eventually, the surface roughness of the protective film 13 having undergone cutting work can be diminished.

Incidentally, the aforesaid cutting condition satisfies the relationship provided by the expression (7). Moreover, under the cutting condition, the mean Rz of roughness levels at ten points on the protective film 13 having undergone cutting work can be set to 0.1 μm or less.

On the substrate side 11a of the semiconductor substrate 11, the bed electrodes 12 electrically connected to semiconductor elements are formed. The protective film 13 is formed over the bed electrodes 12, and the openings 13a through which the bed electrodes 12 are bared are formed from the surface of the protective film 13 toward the bed electrodes 12. The metallic film 14 is formed to cover both the protective film 13 and the surfaces 12a of the bed electrodes 12 bared through the openings 13a. Through cutting work intended to cut the surface of the metallic film 14 at intervals of the pitch P using the cutting tool 321, the metallic electrodes 15 are formed by patterning the metallic film 14 so that only the portion of the metallic film 14 formed inside the openings 13a will remain intact.

Herein, when the pitch P is designated so that the relationship expressed below will be established among the radius of curvature R of the cutting tool 321, the cut depth d in the protective film 13, and the pitch P, an area where the protective film 13 whose surface is plucked to intensify the surface roughness is bared can be cut during cutting to be performed after the cutting tool 321 is moved by the designated pitch P.

$$0 < P \leq 2/3(2Rd - d^2)^{1/2}$$

Consequently, the surface roughness of the protective film 13 having undergone cutting work can be diminished.

Sixth Embodiment

Figure 24:
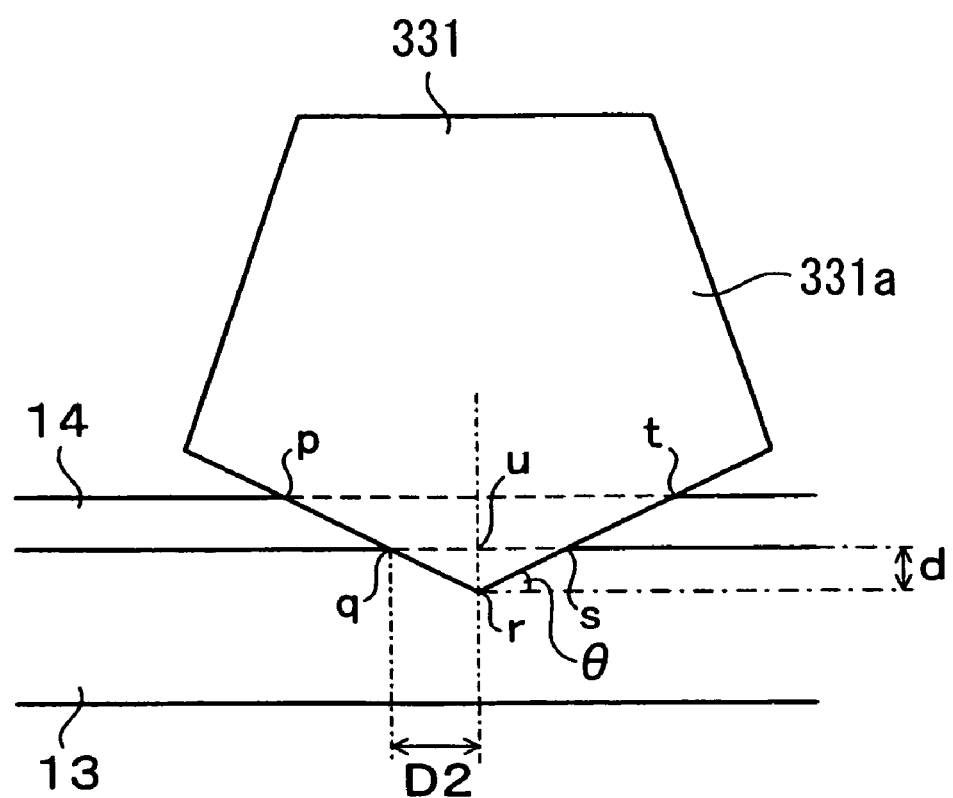
FIG. 24 is a sectional explanatory diagram concerning the states of a metallic electrode and a protective film cut by a cutting tool employed in a metallic electrode forming method in accordance with sixth embodiment.

The sixth embodiment of a metallic electrode forming method for semiconductor devices in accordance with the present invention will be described below with reference to the drawings. FIG. 24 is a sectional explanatory diagram concerning the states of the metallic electrode and protective film cut by the cutting tool employed in the metallic electrode forming method in accordance with the sixth embodiment.

The same reference numerals will be assigned to the components identical to those of the fifth embodiment. An iterative description will be omitted.

As shown in FIG. 24, according to the metallic electrode forming method of the sixth embodiment, a cutting tool 331 which has the edge of the distal part of a cutting face 331a thereof shaped like an isosceles triangle whose sides having an equal length form an angle θ with respect to the metallic film 14 is employed.

In the present embodiment, as the cutting tool 331, a straight tool having an edge whose width is 3 mm on the cutting face 331a thereof and whose angle θ ranges from 2° to 3° is adopted.

A point r is a point at the utmost distal end of the cutting face 331a of the cutting tool 331. In the present embodiment, similarly to the fifth embodiment, since the cutting tool 331 is moved leftward in the drawing, the blade portion on the left side of the point r corresponds to the first blade portion, and the blade portion on the right side of the point r corresponds to the second blade portion.

The sections of the metallic film 14 and protective film 13 assume a shape determined with an isosceles triangle defined with points p, q, r, s, and t. Within segments pr and rt indicating portions of the metallic film and protective film bared by the cutting tool 331, segments pq and st each indicate a bared portion of the metallic film 14, and segments qr and rs each indicate a bared portion of the protective film 13.

Now, a point on the surface of the protective film 13 where a straight line is extended from a point r is defined as a point y, and the length of a segment qy is defined as the maximum cut width D2 of the protective film 13.

For a triangle qry, equations (8) and (9) below are established.

$$\tan \theta = yr/qy = d/D2 \quad (8)$$

Consequently; the maximum cut width D2 is expressed by an equation (9) below using the angle θ and depth d.

$$D2 = d/\tan \theta \quad (9)$$

Similarly to the fifth embodiment, since a relationship expressed by $0 < P \leq 2/3D2$ should merely be satisfied, the pitch P should merely satisfy the relationship provided by an expression (10) below.

$$0 < P \leq 2d/(3 \tan \theta) \quad (10)$$

Once the pitch P satisfies the relationship of the expression (10), the surface roughness of the protective film 13 having undergone cutting work will not be, similarly to that in the fifth embodiment, left. Eventually, the surface roughness of the protective film 13 having undergone cutting work can be improved.

When the cutting tool 331 having the edge of the distal part of the cutting face 331a thereof formed like an isosceles triangle whose sides having an equal length form an angle θ with respect to the metallic film 14 is employed, if the pitch P is designated so that the relationship provided below will be established among the angle θ, the cut depth d in the protective film 13, and the pitch P, an area where the protective film 13 whose surface is plucked to intensify the surface roughness is bared can be cut during cutting to be performed after the cutting tool 331 is moved by the designated pitch P.

$$0 < P \leq 2d/(3 \tan \theta)$$

Consequently, the surface roughness of the protective film 13 having undergone cutting work can be diminished.

(Modifications)

As a cutting tool to be employed in cutting work, the cutting tool 321 or 31 whose cutting face includes a blade portion formed like an arc or an isosceles triangle is adopted. However, the present invention is not limited to the cutting tool.

Any of cutting tools having various shapes may be employed as long as: the cutting tool has in the distal part of the cutting face thereof the first blade portion which is formed to extend from the utmost distal end of the cutting face in a cutting-tool feeding direction, and the second blade portion which is formed to extend from the utmost distal end in a direction opposite to the cutting-tool feeding direction; and the pitch P can be designated so that an area where the protective film 13 is bared by cutting a laminated portion, in which the metallic film 14 is layered on the protective film 13, using the first blade portion can be cut using the second blade portion during cutting to be performed after the cutting tool is moved by the pitch P. For example, the first blade portion and second blade portion may be asymmetrical to each other with respect to a perpendicular that is extended from the utmost distal end of a cutting face to an object of cutting.

For the protective film 13, a resin material whose Young's modulus is small and whose elastically deformable region is wide, such as, polytetrafluoroethylene may be employed. Using the material, plunk of the protective film derived from cutting work can be suppressed. The cut depth in the protective film 13 by the cutting tool 321 or 31 can be increased up to about 50 µm. Consequently, the surface roughness can be diminished, and cutting work can be efficiently achieved.

The above disclosure has the following aspects.

According to a first aspect of the present disclosure, a metallic electrode forming method for semiconductor devices includes: a step of forming bed electrodes, which are electrically connected to semiconductor elements, on the principal side of a semiconductor substrate; a step of forming a protective film over the bed electrodes and forming openings, through which the bed electrodes are bared, from the surface of the protective film toward the bed electrodes; a step of forming a metallic film to cover both the protective film and the surfaces of the bed electrodes bared through the openings; a step of, after the semiconductor substrate on which the metallic film is formed is adsorbed or secured to an adsorption stage that adsorbs or secures the semiconductor substrate, using a surface shape measuring means, which is disposed above the principal side of the semiconductor substrate and measures the surface shape of the semiconductor substrate, to acquire surface shape data of the surface portion of the metallic film on the semiconductor substrate, which is adsorbed and secured to the adsorption stage, covering the protective film; a step of using a deforming means, which deforms the semiconductor substrate secured to the adsorption stage by applying displacements from the adsorption stage side on the basis of the surface shape data acquired using the surface shape measuring means, to deform the semiconductor substrate so that the distance between a cutting plane designated in parallel with the adsorption stage and the surface portion of the semiconductor substrate will fall within a predetermined range; a step of using the surface shape measuring means to measure the surface shape of the surface portion of the deformed semiconductor substrate, and deciding whether the distance between the cutting plane and the surface portion of the deformed semiconductor substrate falls within the predetermined range; a step of, if a decision is made that the distance between the cutting plane and the surface portion of the deformed semiconductor substrate falls within the predetermined range, forming metallic electrodes by patterning the metallic film through cutting work, in which cutting is performed on the cutting plane with the deformed semiconductor substrate left adsorbed or secured to the adsorption stage.

In the above method, bed electrodes electrically connected to semiconductor elements are formed on the principal side of a semiconductor substrate. A protective film is formed over the bed electrodes, and openings through which the bed electrodes are bared are formed from the surface of the protective film toward the bed electrodes. A metallic film is formed to cover both the protective film and the surfaces of the bed electrodes bared through the openings. Metallic electrodes are formed by patterning the metallic film through cutting work in which cutting is performed on a cutting plane.

Herein, after the semiconductor substrate having the metallic film formed thereof is adsorbed or secured to an adsorption stage, a surface shape measuring means is used to acquire surface shape data of the surface portion of the metallic film on the semiconductor substrate, which is adsorbed or secured to the adsorption stage, covering the protective film. Based on the surface shape data, a deforming means for deforming the semiconductor substrate by applying displacements from the adsorption stage side deforms the semiconductor substrate so that the distance between the cutting plane designated in parallel with the adsorption stage and the surface portion of the semiconductor substrate will fall within a predetermined range. The surface shape measuring means is used to measure the surface shape of the deformed semiconductor substrate. If a decision is made that the distance between the cutting plane and surface portion falls within the predetermined range, cutting work is performed on the cutting plane with the semiconductor substrate deformed by the deforming means left adsorbed and secured to the adsorption stage.

When the semiconductor substrate is adsorbed or secured to the adsorption stage, although a difference between concave and convex parts of the surface portion increases while reflecting the back-side shape thereof, the difference between the concave and convex parts of the surface portion can be decreased. Moreover, the distance between the cutting plane and surface portion can be confined to the predetermined range (can be set to a requested degree of precision in cutting work). Consequently, since the precision in cutting work can be improved, a product yield in formation of metallic electrodes can be improved.

Alternatively, at the step of forming the metallic electrodes, the metallic electrodes may be formed by patterning the metallic film so that only the portion of the metallic film formed inside the openings will be left intact. At the step of forming the metallic electrodes, the metallic electrodes are formed by patterning the metallic film so that the portion of the metallic film, which is formed inside the openings will be left intact. The metallic electrodes can therefore be formed on the surfaces of the bed electrodes bared through the openings and on the flanks of the protective film that create a level difference from the openings toward the surfaces of the bed electrodes.

Alternatively, the deforming means may be disposed to abut on the back side of the adsorption stage and applies displacements to the semiconductor substrate via the adsorption stage. The deforming means is disposed to abut on the back side of the adsorption stage, and applies displacements to the semiconductor substrate via the adsorption stage. Consequently, such an event can be prevented that: a stress is locally imposed on the semiconductor substrate by the deforming means; and the semiconductor substrate is locally deformed.

Alternatively, the deforming means may include multiple actuators that generate controllable displacements. Since the deforming means includes multiple actuators that generate control displacements, the deforming means can apply various displacements according to the deformed state of the semiconductor substrate, and can highly precisely control the surface shape of the semiconductor substrate.

Alternatively, the actuators may be piezoelectric actuators each including a piezoelectric element. Since the actuators are piezoelectric actuators each including a piezoelectric element, the precision in displacement control can be improved. Moreover, the piezoelectric actuators make a little backlash and dissipate only a small amount of heat during operation.

Alternatively, the number of measurement points at which the surface shape measuring means may be used to acquire the surface shape data is larger than the number of actuators. Since the number of measurement points at which the surface shape measuring means is used to acquire the surface shape data is larger than the number of actuators, displacements occurring in areas among the actuators can be measured. Consequently, the precision in measurement of a surface shape can be improved.

Alternatively, the surface shape measuring means may measure at least the surface shape of the surface portion at points to which the deforming means applies a displacement. Since the surface shape measuring means measures at least the surface shape of the surface portion at points to which the deforming means applies a displacement, the surface shape measuring means can measure the most greatly deformed portion. Consequently, the precision in measurement of the surface shape can be improved.

Alternatively, the surface shape measuring means may be a laser displacement gauge to be swept along a plane parallel to the cutting plane. Since the surface shape measuring means is a laser displacement gauge to be swept along a plane parallel to the cutting plane, the surface shape measuring means can highly precisely measure the surface shape in a non-contact manner. Moreover, a measurement time can be shortened.

According to a second aspect of the present disclosure, a semiconductor device is fabricated according to a process in which: bed electrodes electrically connected to semiconductor elements are formed on the principal side of a semiconductor substrate; a protective film is formed over the bed electrodes and openings through which the bed electrodes are bared are formed from the surface of the protective film toward the bed electrodes; a metallic film is formed to cover both the protective film and the surfaces of the bed electrodes bared through the openings; and metallic electrodes are formed by patterning the metallic film through cutting work performed on the surface of the metallic film with the back side of the semiconductor substrate left adsorbed or secured to an adsorption stage that adsorbs or secures the semiconductor substrate, a variance in the thickness of a portion cut through cutting work is smaller than the difference between concave and convex parts of the back side of the semiconductor substrate.

In the semiconductor device fabricated according to the process in which metallic electrodes are formed by patterning the metallic film through cutting work performed on the surface of the metallic film with the back side of the semiconductor substrate left adsorbed or secured to the adsorption stage, a variance in the thickness of a portion cut through cutting work is smaller than the difference between concave and convex parts of the back side of the semiconductor substrate. Consequently, an area where a requested degree of precision in a magnitude of cutting is not satisfied will not be present in part of the worked plane. A product yield can be improved.

Alternatively, a level difference may be created so that the surfaces of the bed electrodes bared through the openings will recede from the top of the protective film; and the metallic electrodes may be formed on the surfaces of the bed electrodes bared through the openings and the flanks of the protective film creating the level difference. Since the metallic electrodes are formed on the surfaces of the bed electrodes bared through the openings and the flanks of the protective film creating the level difference, compared with a case where the metallic electrodes are formed merely on the surfaces of the bed electrodes, the strength of the metallic electrodes is improved.

Alternatively, the regions of the metallic electrodes formed on the flanks of the protective film creating the level difference may be brought into contact with solder. Since the regions the metallic electrodes formed on the flanks of the protective film creating the level difference are brought into contact with solder, when the metallic electrodes are soldered, the wetted area of solder can be expanded. Consequently, joint strength can be improved.

Alternatively, the metallic electrodes may be formed to jut out of the top of the protective film through the openings. When the metallic electrodes formed to jut out of the top of the protective film through the openings are employed, a semiconductor device having the metallic electrodes whose surfaces are flat can be provided.

Alternatively, the protective film may be made of a resin. Since a resin material is adopted as the protective film, even when the bed electrodes have thickness, the bed electrodes can be appropriately covered.

According to a third aspect of the present disclosure, a metallic electrode forming method for semiconductor devices includes: a step of forming bed electrodes, which are electrically connected to semiconductor elements, on the principal side of a semiconductor substrate; a step of forming a protective film over the bed electrodes and forming openings, through which the bed electrodes are bared, from the surface of the protective film toward the bed electrodes; a step of forming a metallic film to cover both the protective film and the surfaces of the bed electrodes bared through the openings; a step of adsorbing or securing the semiconductor substrate, on which the metallic film is formed, to a first adsorption stage, which adsorbs or secures the semiconductor substrate to a flat surface, by way of the metallic film side of the semiconductor substrate; a step of preparing a stage, which has a second flat surface designated in parallel to the flat surface of the first adsorption stage, pouring a filler into a gap between a back side opposed to the principal side of the semiconductor substrate and the second flat surface, and curing the filler so as to thus form a flat portion that flattens the back side; and a step of adsorbing or securing the semiconductor substrate, on which the flat portion is formed, to the second adsorption stage by way of the flat portion side of the semiconductor substrate, and forming metallic electrodes by patterning the metallic film through cutting work so that only the portion of the metallic film formed inside the openings will remain intact.

In the above method, bed electrodes electrically connected to semiconductor elements are formed on the principal side of a semiconductor substrate. A protective film is formed over the bed electrodes, and openings through which the bed electrodes are bared are formed from the surface of the protective film toward the bed electrodes. A metallic film is formed to cover both the protective film and the surfaces of the bed electrodes bared through the openings. Metallic electrodes are formed by patterning the metallic film so that only the portion of the metallic film formed inside the openings will remain intact.

Moreover, the metallic film side of the semiconductor substrate is adsorbed or secured to the first adsorption stage in order to flatten the surface of the metallic film. A stage having a second flat surface designated in parallel to the flat surface of the first adsorption stage is prepared. A flat portion that flattens the back side is formed by pouring a filler into a gap between the back side of the semiconductor substrate and the second flat surface, and curing the filler. Consequently, the flatness of the surface of the metallic film is improved. Moreover, even when the semiconductor substrate is adsorbed or secured during cutting work, the surface of the metallic film will not be shaped to have large irregularities while reflecting the original irregular shape of the back side.

Namely, the difference between concave and convex parts of the surface of the metallic film is decreased, and the distance between a cutting plane for the cutting work and the surface of the metallic film is confined to a predetermined range (set to a requested degree of precision in work). Consequently, since the precision in cutting work can be improved, a product yield in formation of metallic electrodes can be improved.

Alternatively, the filler may be made of a material that exhibits fluidity when being heated. When the filler made of a material that exhibits fluidity when being heated, such as, a thermoplastic resin is employed, after the filler is poured into the gap while being heated to exhibit fluidity, once the filler is cooled, the filler is cured. Consequently, the flat portion can be easily formed.

Alternatively, at the step of forming the flat portion, the filler may be applied to the second flat surface, and the stage having the second flat surface is pressed against the back side of the semiconductor substrate in order to pour the filler into the gap between the back side and second flat surface. At the step of forming the flat portion, the filler is applied to the second flat surface, and the stage having the second flat surface is pressed against the back side of the semiconductor substrate in order to pour the filler into the gap between the back side and the second flat surface. Even when a material that is too viscous to readily invade into the gap is adopted as the filler, the filler can be reliably poured into the gap.

According to a fourth aspect of the present disclosure, a metallic electrode forming method for semiconductor devices includes: a step of forming bed electrodes, which are electrically connected to semiconductor elements, on the principal side of a semiconductor substrate; a step of forming a protective film over the bed electrodes, and forming openings, through which the bed electrodes are bared, from the surface of the protective film toward the bed electrodes; a step of forming a metallic film to cover both the protective film and the surfaces of the bed electrodes bared through the openings; a step of adsorbing or securing the semiconductor substrate, on which the metallic film is formed, to a first adsorption stage, which adsorbs or secures the semiconductor substrate to a flat surface, by way of the metallic film side of the semiconductor substrate; a step of preparing both a third adsorption stage that adsorbs or secures the back side of the semiconductor substrate, and a displacing means for applying displacements from a side of the third adsorption stage opposite to the side thereof to which the semiconductor substrate is adsorbed or secured, using the displacing means to apply displacements to the third adsorption stage so as to thus deform the third adsorption stage so that the third adsorption stage will abut on the back side of the semiconductor substrate adsorbed or secured to the first adsorption stage; and a step of adsorbing or securing the back side of the semiconductor substrate to the third adsorption stage while sustaining the displacements, and forming metallic electrodes by patterning the metallic film through cutting work so that only the portion of the metallic film formed inside the openings will remain intact.

In the above method, bed electrodes electrically connected to semiconductor elements are formed on the principal side of a semiconductor substrate. A protective film is formed over the bed electrodes, and openings through which the bed electrodes are bared are formed from the surface of the protective film toward the bed electrodes. A metallic film is formed to cover both the protective film and the surfaces of the bed electrodes bared through the openings. Metallic electrodes are formed by patterning the metallic film through cutting work so that only the portion of the metallic film formed inside the openings will remain intact.

Moreover, a third adsorption stage that adsorbs or secures the back side of the semiconductor substrate, and a displacing means that applies displacements to a side of the third adsorption stage opposite to the side thereof to which the semiconductor substrate is adsorbed or secured are prepared. The displacing means is used to apply displacements to the third adsorption stage in order to deform the third adsorption stage so that the third adsorption stage will abut on the back side of the semiconductor substrate adsorbed or secured to the first adsorption stage. While the displacements are sustained, the semiconductor substrate is adsorbed or secured to the third adsorption stage by way of the back side thereof. The metallic film is patterned through cutting work in order to form metallic electrodes. Consequently, the flatness of the surface of the metallic film is improved. Even when the semiconductor substrate is adsorbed or secured during cutting work, the surface of the metallic film will not be shaped to have large irregularities while reflecting the original irregular shape of the back side.

Namely, the difference between concave and convex parts of the surface of the metallic film is decreased, and the distance between a cutting plane for the cutting work and the surface of the metallic film is confined to a predetermined range (set to a requested degree of precision in work). Consequently, since the precision in cutting work can be improved, a product yield in formation of metallic electrodes can be improved.

Alternatively, the displacing means may include multiple actuators that generate controllable displacements. The displacing means includes multiple actuators that generate controllable displacements. Therefore, since difference displacements can be applied according to the shape of the back side of the semiconductor substrate, the third adsorption stage can be highly precisely deformed so that it will abut on the back side of the semiconductor substrate.

Alternatively, the actuators may be piezoelectric actuators each including a piezoelectric element. Since the actuators are piezoelectric actuators each including a piezoelectric element, the precision in displacement control can be improved. Moreover, a backlash made by the piezoelectric actuators is limited, and an amount of heat dissipated therefrom during operation is small.

According to a fifth aspect of the present disclosure, a metallic electrode forming method for semiconductor devices includes: a step of forming bed electrodes, which are electrically connected to semiconductor elements, on a substrate side of a semiconductor substrate; a step of forming a protective film over the bed electrodes, and forming openings, through which the bed electrodes are bared, from the surface of the protective film toward the bed electrodes; a step of forming a metallic film to cover both the protective film and the surfaces of the bed electrodes bared through the openings; a step of forming metallic electrodes by patterning the metallic film through cutting work, which is intended to cut the surface of the metallic film at intervals of a predetermined pitch using a cutting tool, so that only the portion of the metallic film formed inside the openings will remain intact. Herein, the cutting tool has in the distal part of the cutting face thereof a first blade portion formed to extend from the utmost distal end of the cutting fact in a cutting-tool feeding direction, and a second blade portion formed to extend from the utmost distal end in a direction opposite to the cutting-tool feeding direction. The pitch is designated so that an area where the protective film is bared by cutting a laminated portion, in which the metallic film is layered on the protective film, using the first blade portion will be cut using the second blade portion during cutting to be performed after the cutting tool is moved by the pitch.

In the above method, bed electrodes electrically connected to semiconductor elements are formed on a substrate side of a semiconductor substrate. A protective film is formed over the bed electrodes, and openings through which the bed electrodes are bared are formed from the surface of the protective film toward the bed electrodes. A metallic film is formed to cover both the protective film and the surfaces of the bed electrodes bared through the openings. Metallic electrodes are formed by patterning the metallic film through cutting work, which is intended to cut the surface of the metallic film at intervals of a predetermined pitch using a cutting cool, so that only the portion of the metallic film formed inside the openings will remain intact.

The cutting tool employed in cutting work has, in the distal part of the cutting face thereof, a first blade portion formed to extend from the utmost distal end of the cutting face in a cutting-tool feeding direction, and a second blade portion formed to extend from the utmost distal end in a direction opposite to the cutting-tool feeding direction. An area where the protective film which has been cut by the first blade portion and whose surface has been plucked to intensify the surface roughness is bared can be cut using the second blade portion during cutting to be performed after the cutting tool is moved by the designated pitch. Consequently, the surface roughness of the protective film having undergone cutting work can be diminished.

Alternatively, the cutting tool may have the first and second blade portions thereof shaped to form a continuous arc having a radius of curvature R; and the pitch may be designated so that a relationship expressed below will be established among the radius of curvature R, a cut depth d in the protective film caused by the cutting tool, and the pitch P.

$$0<P\leq 2/3(2Rd-d^2)^{1/2}$$

When the cutting tool having the first and second blade portions thereof shaped to form a continuous arc having the radius of curvature R is employed, when the pitch is designated so that the relationship expressed below will be established among the radius of curvature R, the cut depth d in the protective film, and the pitch P, the surface roughness of the protective film having undergone cutting work can be diminished.

$$0<P\leq 2/3(2Rd-d^2)^{1/2}$$

Alternatively, the cutting tool may have the first and second blade portions thereof shaped to tilt by an angle θ with respect to the surface of the metallic film; and the pitch is designated so that a relationship expressed below will be established among the angle θ, the cut depth d in the protective film caused by the cutting tool, and the pitch P.

$$0<P\leq 2d/(3\tan\theta)$$

When the cutting tool having the first and second blade portions thereof shaped to tilt by the angle θ with respect to the surface of the metallic film is employed, if the pitch is designated so that the relationship expressed below will be established among the angle θ, the cut depth d in the protective film, and the pitch, the surface roughness of the protective film having undergone cutting work can be diminished.

$$0<P\leq 2d/(3\tan\theta)$$

On the cutting face of the cutting tool, an angle formed by the first and second blade portions is $180°-2\theta$.

Alternatively, the protective film may be made of a polyimide resin, and the cut depth therein is 8 μm or less.

When the protective film is made of a polyimide resin, if the cut depth therein is set to 8 μm or less, the surface roughness of the protective film having undergone cutting work can be diminished.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A metallic electrode forming method for a semiconductor device comprising:
   forming a bed electrode on a principal surface of a semiconductor substrate, wherein the bed electrode is electrically connected to a semiconductor element; forming a protective film on the bed electrode, and
   forming an opening in the protective film so that the bed electrode is exposed from the opening;
   forming a metallic film on the protective film to cover the protective film and the opening of the protective film;
   mounting the semiconductor substrate with the metallic film on an adsorption stage, and measuring a surface shape of at least a part of the metallic film by a surface shape measuring means, wherein the adsorption stage adsorbs and fixes the semiconductor substrate on the stage, and wherein the part of the metallic film is disposed on the protective film;
   deforming the semiconductor substrate based on a surface shape data of the part of the metallic film by using a deforming means capable of displacing the semiconductor substrate so that a difference between the principal surface of the semiconductor substrate and a cutting surface is within a predetermined range, and wherein the deforming means is disposed on a stage side;
   measuring a surface shape of the principal surface of the semiconductor substrate, and determining whether a difference between the cutting surface and the principal surface of the semiconductor substrate is within a predetermined range; and
   cutting the semiconductor substrate with the metallic film along with the cutting surface so that the metallic film is patterned to be a metallic electrode when the difference between the cutting surface and the principal surface of the semiconductor substrate is within the predetermined range.

2. The method according to claim 1,
wherein, in the cutting the semiconductor substrate with the metallic film, only a part of the metallic film remains in the opening of the protective film so that the part of the metallic film provides the metallic electrode.

3. The method according to claim 1,
wherein the deforming means is disposed on a backside of the adsorption stage so that the deforming means is opposite to the semiconductor substrate, and wherein the deforming means displaces the semiconductor substrate via the adsorption stage.

4. The method according to claim 1,
wherein the deforming means includes a plurality of actuators, and
wherein each actuator independently displaces the semiconductor substrate.

5. The method according to claim 4,
wherein each actuator is a piezoelectric actuator having a piezoelectric element.

6. The method according to claim 4,
wherein the surface shape measuring means measures the surface shape of the metallic film at a plurality of measurement points, and
wherein the number of measurement points is larger than the number of actuators.

7. The method according to claim 1,
wherein the surface shape measuring means measures the surface shape of the metallic film at a plurality of measurement points, and
wherein the deforming means displaces the semiconductor substrate in such a manner that the deforming means applies displacement to the semiconductor substrate at a plurality of displacement points, each of which corresponds to the measurement point.

8. The method according claim 1,
wherein the surface shape measuring means is a laser displacement gauge, which scans the surface shape of the metallic film along with a plane parallel to the cutting surface.

9. A metallic electrode forming method for a semiconductor device comprising:
forming a bed electrode on a principal surface of a semiconductor substrate, wherein the bed electrode is electrically connected to a semiconductor element;
forming a protective film on the bed electrode, and forming an opening in the protective film so that the bed electrode is exposed from the opening;
forming a metallic film on the protective film to cover the protective film and the opening of the protective film;
mounting the semiconductor substrate on a first adsorption stage to contact the metallic film on the first adsorption stage, wherein the first adsorption stage includes a first flat surface for adsorbing the semiconductor substrate thereon;
arranging the semiconductor substrate over a third adsorption stage in such a manner that the backside surface faces the third adsorption stage, arranging a displacing means under the third adsorption stage in such a manner that the displacing means is opposite to the semiconductor substrate, and applying displacement to the third adsorption stage so that the third adsorption stage fits and contacts the backside surface of the semiconductor substrate; and
adsorbing and fixing the backside surface of the semiconductor substrate on the third adsorption stage, and cutting the semiconductor substrate with the metallic film so that only a part of the metallic film remains in the opening of the protective film, wherein the part of the metallic film provides a metallic electrode.

10. The method according to claim 9,
wherein the displacing means includes a plurality of actuators, and wherein each actuator is capable of controlling the displacement independently.

11. The method according to claim 10,
wherein each actuator is a piezoelectric actuator including a piezoelectric element.

* * * * *